(12) United States Patent
Suzuki et al.

(10) Patent No.: US 10,916,574 B2
(45) Date of Patent: Feb. 9, 2021

(54) IMAGING DEVICE, METHOD OF MANUFACTURING THE SAME, AND APPARATUS

(71) Applicant: CANON KABUSHIKI KAISHA, Tokyo (JP)

(72) Inventors: Takahiro Suzuki, Kawasaki (JP); Yoshiei Tanaka, Hachioji (JP); Tsutomu Tange, Yokohama (JP); Katsunori Hirota, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/275,652

(22) Filed: Feb. 14, 2019

(65) Prior Publication Data
US 2019/0280023 A1 Sep. 12, 2019

(30) Foreign Application Priority Data

Mar. 12, 2018 (JP) ................................. 2018-044665
Nov. 20, 2018 (JP) ................................. 2018-217521

(51) Int. Cl.
*H01L 27/146* (2006.01)

(52) U.S. Cl.
CPC .... *H01L 27/1462* (2013.01); *H01L 27/14612* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 6,333,547 B1 | 12/2001 | Tanaka et al. | |
| 8,982,254 B2 | 3/2015 | Shoyama | |
| 9,893,114 B2* | 2/2018 | Endo | H01L 27/14685 |
| 2015/0214269 A1 | 7/2015 | Endo | |
| 2018/0070041 A1 | 3/2018 | Hirota et al. | |
| 2019/0096946 A1 | 3/2019 | Hirota et al. | |

FOREIGN PATENT DOCUMENTS

JP 2013-84693 A 5/2013

OTHER PUBLICATIONS

Hirota et al., U.S. Appl. No. 16/137,861, filed Sep. 21, 2018.
Extended European Search Report in European Application No. 19156829.4 (dated Jul. 11, 2019).

* cited by examiner

*Primary Examiner* — Robert K Carpenter
(74) *Attorney, Agent, or Firm* — Venable LLP

(57) ABSTRACT

An imaging device includes a substrate including a photoelectric conversion portion and an insulating layer formed to cover at least a part of the photoelectric conversion portion. The insulating layer contains silicon, nitrogen, and chlorine. In an embodiment, in at least a part of the insulating layer, a ratio of silicon atoms bonded to one, two, or three nitrogen atoms and not bonded to an oxygen atom is not more than 20% in silicon atoms contained in at least the part.

10 Claims, 11 Drawing Sheets

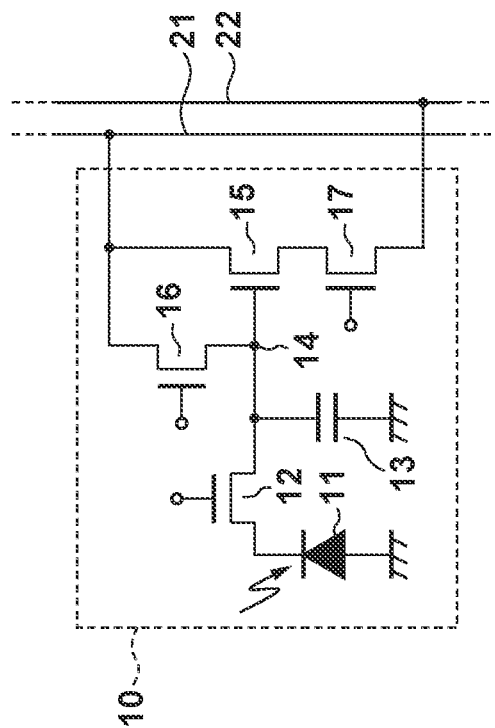
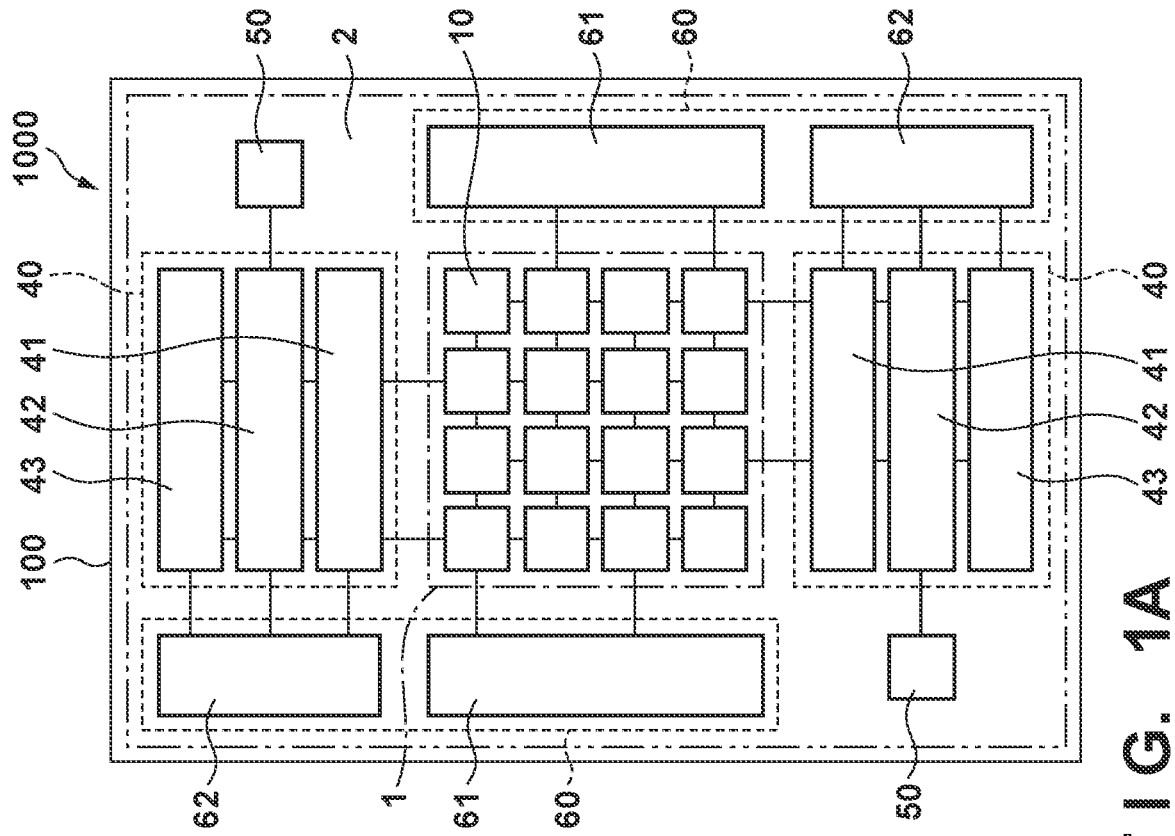

X1: Si, C, F, Cl, H, OR DANGLING BOND
X2: Si, C, F, Cl, H, OR DANGLING BOND
X3: Si, C, F, Cl, H, OR DANGLING BOND

X1: Si, C, F, Cl, H, OR DANGLING BOND
X2: Si, C, F, Cl, H, OR DANGLING BOND

IMAGING DEVICE, METHOD OF MANUFACTURING THE SAME, AND APPARATUS

BACKGROUND OF THE INVENTION

Field of the Invention

The present invention relates to an imaging device, a method of manufacturing the same, and an apparatus.

Description of the Related Art

To efficiently use light incident on a photoelectric conversion portion, a method of forming silicon nitride which functions as an antireflection layer on the photoelectric conversion portion is known. Japanese Patent Laid-Open No. 2013-84693 describes a method of forming silicon nitride on a photoelectric conversion portion by low-pressure CVD (LP-CVD) by using hexachlorodisilane (HCD) as a source gas.

SUMMARY OF THE INVENTION

When silicon nitride is formed on a photoelectric conversion portion by using hexachlorodisilane as described in Japanese Patent Laid-Open No. 2013-84693, the dark output characteristic of a pixel may change depending on the composition of silicon nitride, if the photoelectric conversion portion is irradiated with very intense light. This sometimes changes the dark output of a solid-state imaging device. An aspect of the present invention provides a technique advantageous in stabilizing the characteristics of an imaging device.

An embodiment of the present invention provides an imaging device comprising: a substrate including a photoelectric conversion portion; and an insulating layer formed to cover at least a part of the photoelectric conversion portion, wherein the insulating layer contains silicon, nitrogen, and chlorine, and in at least a part of the insulating layer, a ratio of silicon atoms bonded to one, two, or three nitrogen atoms and not bonded to an oxygen atom is not more than 20% in silicon atoms contained in at least the part.

Further features of the present invention will become apparent from the following description of exemplary embodiments (with reference to the attached drawings).

BRIEF DESCRIPTION OF THE DRAWINGS

FIGS. 1A and 1B are views for explaining a configuration example of an imaging device and a circuit configuration example of pixels arranged in the imaging device according to an embodiment of the present invention;

DESCRIPTION OF THE EMBODIMENTS

Figure 2A:
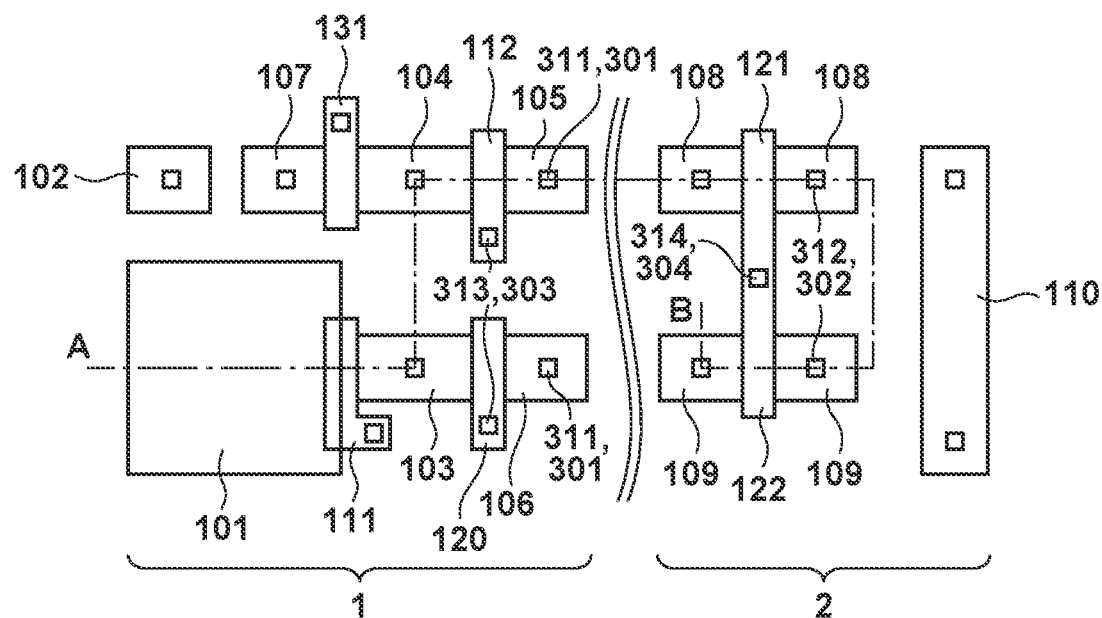
FIGS. 2A and 2B are a plan view and a sectional view showing a configuration example of an imaging device of a first embodiment.

The first embodiment and practical examples of an imaging device according to the present invention will be explained with reference to the accompanying drawings. In the following explanation and drawings, common reference numerals denote common parts throughout the plurality of drawings. Therefore, the common parts will be explained by referring to the plurality of drawings, and an explanation of the parts given the common reference numerals will be omitted as needed.

The arrangement of the imaging device according to a first embodiment of the present invention and a method of manufacturing the same will be explained with reference to FIGS. 1A to 10. FIG. 1A is a view showing a configuration example of an imaging device 1000 according to the first embodiment of the present invention. The imaging device 1000 includes a pixel region 1 in which a plurality of pixels 10 are arranged, and a peripheral circuit region 2 in which peripheral circuits for, for example, processing signals output from the pixels 10 are arranged. The pixel region 1 and the peripheral circuit region 2 are formed on a substrate 100. The substrate 100 is a semiconductor substrate made of silicon or the like. Referring to FIG. 1A, a region enclosed with the alternate long and short dashed lines is the pixel region 1, and a region between the alternate long and short dashed lines and the alternate long and two short dashed lines is the peripheral circuit region 2. It can be said that the peripheral circuit region 2 is positioned around the pixel region 1, and positioned between the pixel region 1 and the edges of the substrate 100. The pixel region 1 shown in FIG. 1A is an example of an area sensor in which the plurality of pixels 10 are arranged in the form of a two-dimensional array. Instead, the pixel region 1 can also be a linear sensor in which the plurality of pixels 10 are arrayed in the one-dimensional direction.

FIG. 1B is a view showing a circuit configuration example of the individual pixels 10 arrayed in the pixel region 1. The pixel 10 includes a photoelectric conversion portion 11, a transfer element 12, a capacitance element 13, an amplification element 15, a reset element 16, and a selection element 17. The photoelectric conversion portion 11 converts incident light into an electrical signal. In this embodiment, a photodiode formed on the substrate 100 is used as the photoelectric conversion portion 11.

Transistors formed on the substrate 100 are used as the amplification element 15, the reset element 16, and the selection element 17. In this specification, these transistors arranged in the pixel 10 will be called pixel transistors. As each pixel transistor, a MISFET (Metal-Insulator-Semiconductor Field-Effect Transistor) can be used. For example, it is also possible to use a MOSFET (Metal-Oxide-Semiconductor Field-Effect Transistor) using silicon oxide as a gate insulating film of the MISFET. However, the gate insulating film is not limited to this and may also be, for example, silicon nitride. The gate insulating film may further be a so-called high-k gate insulating film such as hafnium oxide. The gate insulating film can be a stack of these films, and can also be a compound such as silicon oxynitride.

The transfer element 12 has a MOS gate structure. Accordingly, when the transfer element 12 is a gate, the photoelectric conversion portion 11 is a source, and the capacitance element 13 is a drain, this structure can be regarded as a transistor. Therefore, the photoelectric conversion portion 11, the transfer element 12, and the capacitance element 13 can be called pixel transistors.

The transfer element 12 transfers signal charge generated in the photoelectric conversion portion 11 to the capacitance element 13. The capacitance element 13 functions as a charge-voltage conversion element which causes a node 14 to generate a voltage corresponding to the capacitance and the amount of signal charge. The gate of the amplification element 15 is connected to the capacitance element 13 via the node 14. The drain of the amplification element 15 is connected to a power line 21, and the source of the amplification element 15 is connected to an output line 22 via the selection element 17. The capacitance element 13 and the gate of the amplification element 15 are connected to the power line 21 via the reset element 16. By turning on the reset element 16, the potential of the node 14 is reset to a potential corresponding to the potential of the power line 21. Also, a signal corresponding to the potential of the node 14 is output from the amplification element 15 to the output line 22 by turning on the selection element 17. The configuration of the pixel 10 is not limited to that shown in FIG. 1B, and need only be able to output, to the peripheral circuit region 2, an electrical signal generated by the photoelectric conversion portion 11 in accordance with incident light.

In this embodiment, a MOSFET (nMOSFET) having an n-type channel (inversion layer) is used as each pixel transistor. However, a pMOSFET having a p-type channel may also be included. Also, a transistor other than the MISFET can be included as the pixel transistor. For example, the amplification element 15 can be a JFET (Junction FET), and can also be a bipolar transistor.

In the following explanation of this specification, a conductivity type matching a conductivity type which uses electric charge to be processed as signal charge in the pixel region 1 as a majority carrier will be called a first conductivity type, and a conductivity type matching a conductivity type which uses electric charge to be processed as signal charge as a minority carrier will be called a second conductivity type. For example, when using an electron as signal charge, an n-type is the first conductivity type, and a p-type is the second conductivity type.

Referring to FIG. 1A again, the peripheral circuit region 2 will be explained. The peripheral circuit region 2 includes a signal processing unit 40 for processing an electrical signal generated by the pixel 10. The peripheral circuit region 2 also includes an output unit 50 for outputting the signal processed by the signal processing unit 40 to the outside of the imaging device 1000, and a control unit 60 for controlling the pixel region 1 in which the plurality of pixels 10 are arrayed, and the signal processing unit 40. The signal processing unit 40, the output unit 50, and the control unit 60 can be called peripheral circuits.

In this embodiment, the signal processing unit 40 includes an amplification circuit 41 having a plurality of columnar amplifiers, a conversion circuit 42 having a plurality of AD converters, and a horizontal scanning circuit 43 for selecting an output from the conversion circuit 42 and outputting the selected signal to the output unit 50. The signal processing unit 40 can perform a correlated double sampling (CDS) process, a parallel-serial conversion process, an analog-digital conversion process, and the like. The output unit 50 includes an electrode pad and a protection circuit. The control unit 60 includes a vertical scanning circuit 61 and a timing generation circuit 62. The configuration of the peripheral circuit region 2 is not limited to this, and need only be able to appropriately process an electric signal generated by each pixel 10 in the pixel region 1 and output the processed signal outside the imaging device 1000.

The peripheral circuit can be configured by using, for example, a MISFET like the pixel transistor, and can be configured by a CMOS (Complementary MOS) circuit including an nMOSFET and a pMOSFET. In this specification, a transistor forming the peripheral circuit will be called a peripheral transistor, and will be called a peripheral nMOSFET or a peripheral pMOSFET when specifying the conductivity type. The peripheral circuit may also include a passive element such as a resistance element or a capacitance element, in addition to an active element such as a transistor or a diode.

Figure 2B:
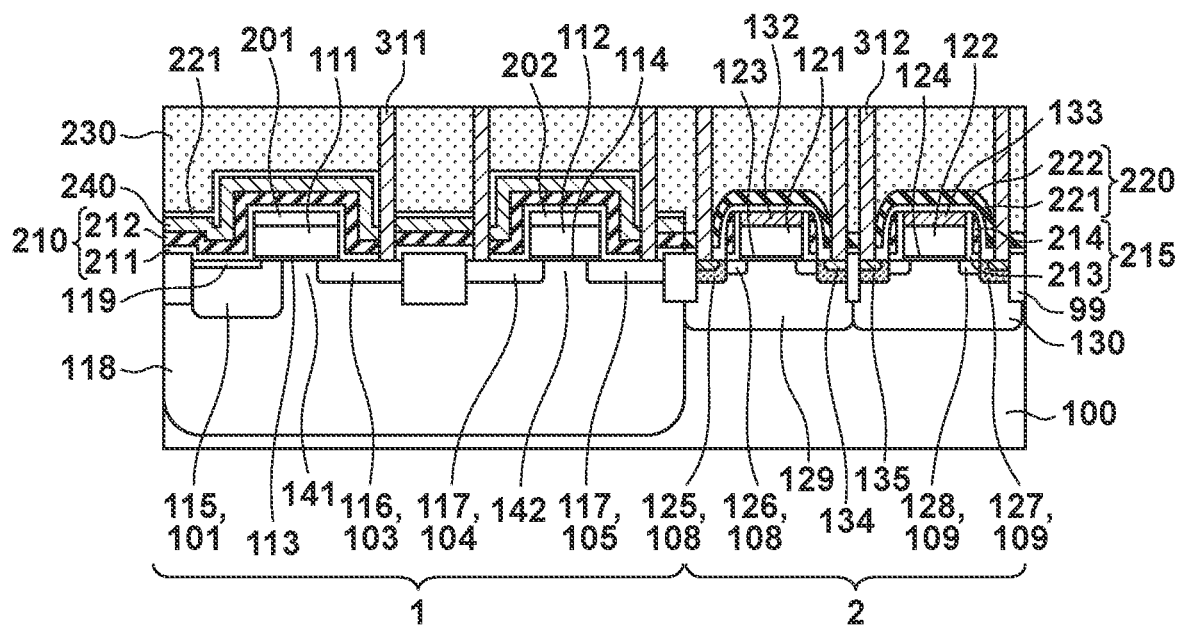

Next, the structure of the imaging device 1000 of this embodiment will be explained with reference to FIGS. 2A and 2B. FIGS. 2A and 2B are respectively a plan view and a sectional view showing portions of the pixel region 1 and the peripheral circuit region 2.

In FIG. 2A, a region 101 is equivalent to the photoelectric conversion portion 11, a region 103 is equivalent to the capacitance element 13 and the node 14 for detecting electric charge, and a region 106 is equivalent to the drain region of the reset element 16. A region 104 is equivalent to the source region of the amplification element 15, a region 105 is equivalent to the drain region of the amplification element 15, and a region 107 is equivalent to the source of the selection element 17. The region 103 also functions as the source of the reset element 16, and the region 104 also functions as the drain region of the selection element 17. Gate electrodes 111, 120, 112, and 131 are respectively equivalent to the gate of the transfer element 12, the gate of the reset element 16, the gate of the amplification element 15, and the gate of the selection element 17. Regions 108 and 109 are respectively equivalent to the source/drain regions of a peripheral nMOSFET or a peripheral pMOSFET. Gate electrodes 121 and 122 are equivalent to the gate of the peripheral nMOSFET or the peripheral pMOSFET. In this embodiment, each gate electrode is formed by polysilicon (polycrystalline silicon). In addition, the gate electrodes 121 and 122 are integrated in this embodiment, but they may also be formed independently of each other. The gate electrodes and the regions 103 to 109 equivalent to the source/drain regions are connected to interconnections (not shown) via conductive members 311, 312, 313, and 314 buried in contact holes 301, 302, 303, and 304.

In FIG. 2A, a reference contact region 102 of the pixel 10 can be formed in the pixel region 1. The reference contact region 102 supplies a reference potential such as a ground potential to the pixel 10 via an interconnection (not shown). By forming a plurality of reference contact regions 102 in the pixel region 1, it is possible to suppress variations in reference potential and the occurrence of shading in a captured image in the pixel region 1.

In FIG. 2A, a resistance element 110 can be formed in the peripheral circuit region 2. The resistance element 110 is an impurity region formed in the substrate 100. By forming contacts on the two sides of this impurity region, it is possible to obtain a resistance corresponding to the impurity concentration, the distance between the contacts, and the width of the impurity region. In this embodiment, the impurity region of the resistance element 110 is an impurity region having an n-type as the first conductivity type formed in a well having a p-type as the second conductivity type. Instead, the impurity region of the resistance element 110 may also be a p-type impurity region formed in an n-type well. In addition, a resistance element formed by an n-type impurity region and a resistance element formed by a p-type impurity region can coexist. The peripheral circuit region 2 may also include a passive element other than the resistance element 110, such as a capacitance element or resistance element having a MOS structure made of polysilicon.

In this embodiment, the regions 101 and 103, the regions 104, 105, 106, and 107 equivalent to the source/drain regions of the pixel transistors, the reference contact regions 102, and the regions 108 equivalent to the source/drain regions of the peripheral nMOSFET are n-type impurity regions. Also, the regions 109 equivalent to the source/drain regions of the peripheral pMOSFET are p-type impurity regions.

FIG. 2B is a sectional view taken along a line A-B in FIG. 2A. The substrate 100 is a semiconductor substrate such as silicon as described above. The substrate 100 is divided into a plurality of active regions by an element isolation region 99. The element isolation region 99 can be made of an element isolation insulator formed by a shallow trench isolation (STI) method, a selective oxidation (LOCOS) method, or the like. An impurity region is formed in each active region, and forms a semiconductor element. As the element isolation region, therefore, an impurity region (for example, a p-type impurity region) for p-n junction isolation may also be formed.

A well having a conductivity type corresponding to the conductivity type of each element is formed in the active region of the substrate 100. A p-type well 118 is formed in the pixel region 1, and a p-type well 129 and an n-type well 130 are formed in the peripheral circuit region 2. Also, a p-type impurity region having an impurity concentration higher than that of the p-type well 118 is formed in the reference contact region 102 shown in FIG. 2A. A reference potential is supplied to the well 118 via the reference contact region 102 from an interconnection connected to the reference contact region 102.

The sectional structures of the pixel region 1 and the peripheral circuit region 2 will be explained below with reference to FIG. 2B. For the sake of explanation, FIG. 2B and FIGS. 7A to 8C (to be described later) depict the pixel region 1 and the peripheral circuit region 2 as they are adjacent to each other. First, the sectional structure of the pixel region 1 will be explained. An n-type storage region 115 forming the photoelectric conversion portion 11 is formed in the region 101. The storage region 115 forms a p-n junction together with the p-type well 118, and functions as a photodiode of the photoelectric conversion portion 11. A p-type surface region 119 for forming the photoelectric conversion portion 11 as a pinned photodiode is formed between the storage region 115 and the surface of the substrate 100. An impurity region 116 forming the capacitance element 13 is formed in the region 103. The impurity region 116 is a floating diffusion region. N-type impurity regions 117 are formed as the source/drain regions of the amplification element 15, the reset element 16, and the selection element 17. FIG. 2B shows the section of the amplification element 15, but the reset element 16 and the selection element 17 can also have a similar sectional structure.

The gate insulating films 113 and 114 and gate insulating films of elements such as other pixel transistors contain silicon oxide as a main material, and this silicon oxide can be silicon oxide formed by plasma nitriding or thermal oxynitriding and containing a slight amount (for example, less than 10%) of nitrogen. Nitrogen-containing silicon oxide has a dielectric constant higher than that of pure silicon oxide, and hence can improve the drivability of the transistor. However, the material of the gate insulating film is not limited to this, and the gate insulating film can be pure silicon oxide or silicon nitride. It is also possible to use a high-k material such as hafnium oxide or a compound or multilayered film of these materials as described previously. The upper surfaces of the gate electrodes 111 and 112 formed on the gate insulating films 113 and 114 on the substrate 100 are covered with insulating layers 201 and 202 containing silicon oxide or silicon nitride.

An insulating film 210 including a silicon oxide layer 211 and a silicon nitride layer 212 is formed on the pixel region 1. The silicon oxide layer 211 is an insulating layer containing silicon and oxygen. The silicon nitride layer 212 is an insulating layer containing not only silicon and nitrogen but also chlorine. The silicon nitride layer 212 can further contain oxygen. The insulating film 210 covers the upper surfaces of the gate electrodes 111 and 112 with the insulating layers 201 and 202 being interposed between them, and covers the side surfaces of the gate electrodes 111 and 112 without the insulating layers 201 and 202. That is, the silicon nitride layer 212 extends from the upper portion of the photoelectric conversion portion 11 to the upper portion of the amplification element 15. The silicon nitride layer 212 (to be described later) advantageously acts to improve not only the characteristics of the photoelectric conversion portion 11 but also the characteristics of the amplification element 15. Although not shown in FIG. 2B, the insulating film 210 similarly covers the upper surfaces and side surfaces of the gate electrodes 120 and 131. Also, the insulating film 210 covers the region 101 forming the photoelectric conversion portion 11, and the regions 103 to 107 equivalent to the source/drain regions of the pixel transistors. In this case, the distance between the lower surface of that portion of the silicon nitride layer 212, which covers the region 101 forming the photoelectric conversion portion 11, and the surface of the substrate 100 is shorter than the distance between the upper surface of the gate electrode of the pixel transistor and the surface of the substrate 100. The shorter the distance between the silicon nitride layer 212 and the substrate 100, the larger the influence of the composition of the silicon nitride layer 212. The distance between the silicon nitride layer 212 and the substrate 100 can relatively be defined by comparison with the upper surface of the gate electrode as described above. The distance between the silicon nitride layer 212 and the substrate 100 is typically less than 100 nm, and can also be less than 50 nm or less than 25 nm.

The insulating film 210 is a multilayered film of the silicon oxide layer 211 and the silicon nitride layer 212. The silicon oxide layer 211 and the silicon nitride layer 212 have interfaces in contact with each other. In this embodiment, the silicon oxide layer 211 is in contact with the side surfaces of the gate electrodes 111, 112, 120, and 131. However, another layer may also be sandwiched between the silicon oxide layer 211 and the side surfaces of the gate electrodes 111, 112, 120, and 131. Furthermore, the silicon oxide layer 211 is in contact with the region 101 forming the photoelectric conversion portion 11, and with the regions 103 to 107 equivalent to the source/drain regions of the pixel transistors, and forms an interface with the substrate 100, but another layer may also be interposed between them.

The insulating film 210 as a multilayered film including the silicon oxide layer 211 having a refractive index of about 1.4 to 1.5 with respect to light having a wavelength of 633 nm and the silicon nitride layer 212 having a refractive index of about 1.9 to 2.1 with respect to the same light covers the region 101 forming the photoelectric conversion portion 11. Accordingly, the insulating film 210 can function as an antireflection layer against light to be incident on the photoelectric conversion portion 11. To obtain a favorable antireflection characteristic, the thickness of the silicon nitride layer 212 can be equal to or larger than that of the silicon oxide layer 211. Furthermore, the thickness of the silicon nitride layer 212 can be larger than that of the silicon oxide layer 211.

A protective film 240 is formed on the insulating film 210 so as to cover the insulating film 210. The protective film 240 can be a monolayered film or a multilayered film of insulators such as silicon oxide and silicon nitride. A silicon oxide layer 221 is formed on the protective film 240 so as to cover the protective film 240. An insulating film 230 is formed on the silicon oxide layer 221 so as to cover the silicon oxide layer 221. The insulating film 230 can be silicate glass such as BPSG, BSG, or PSG or silicon oxide. The upper surface of the insulating film 230 can be a flat surface which does not practically reflect the unevenness of the underlying surface.

The contact holes 301 and 303 are formed to extend through the insulating film 230, the silicon oxide layer 221, the protective film 240, and the insulating film 210. The conductive members 311 and 313 for electrically connecting an interconnection (not shown) and the pixel transistors are formed in the contact holes 301 and 303. In the arrangement shown in FIG. 2A, the conductive members 311 are connected to the regions 103 to 107 equivalent to the source/drain regions of the pixel transistors and the reference contact region 102, and the conductive members 313 are connected to the gate electrodes 111, 112, 120, and 131. The conductive members 311 and 313 are contact plugs mainly made of a metal such as tungsten.

The concentration of chlorine contained in the silicon nitride layer 212 of the insulating film 210 and the bonding state of silicon will be explained below. The present inventors have found by experiments that the characteristics of the imaging device change in accordance with the concentration of chlorine contained in the silicon nitride layer 212. More specifically, since the chlorine-containing silicon nitride layer 212 covers the region 101, hydrogen or chlorine contained in the silicon nitride layer 212 terminates the dangling bond of the photoelectric conversion portion 11, and this makes it possible to decrease the dark current of the imaging device 1000. The silicon nitride layer 212 also reduces the interface state of the channel of a transistor with respect to the amplification element 15 covered with the silicon nitride layer 212. This can improve the noise characteristic of the amplification element 15.

Figure 3A:
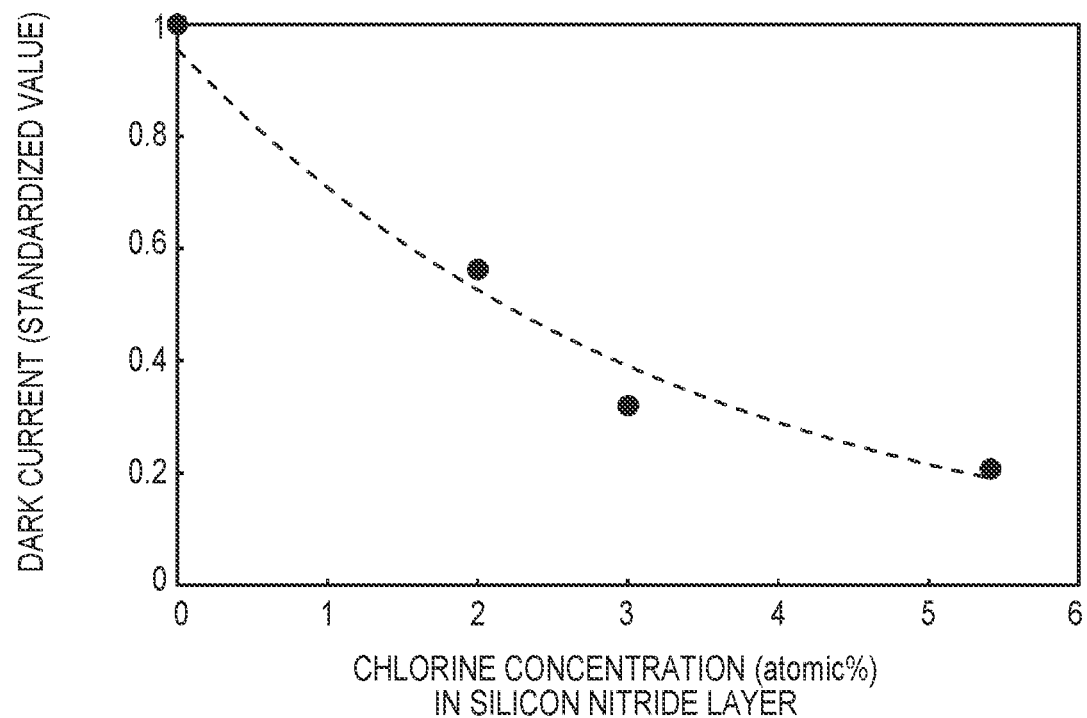
FIGS. 3A and 3B are views for explaining the relationship between the chlorine concentration in a silicon nitride layer and a dark current, and the relationship between the ratio of $SiN_x$ bonds in the silicon nitride layer and a change in dark output before and after irradiation with light.

The relationship between the chlorine concentration in the silicon nitride layer 212 and the dark current will be explained with reference to FIG. 3A. In FIG. 3A, the abscissa indicates the chlorine concentration in the silicon nitride layer 212, and the ordinate indicates the value of the dark current. The value on the ordinate is standardized such that the value of the dark current is 1 when the chlorine concentration is 0 atomic %. FIG. 3A reveals that the dark current of the photoelectric conversion portion 11 decreases as the chlorine concentration in the silicon nitride layer 212 increases. Accordingly, the level of the dark current can be decreased by adding chlorine to the silicon nitride layer 212, when compared to a case in which the silicon nitride layer 212 does not contain chlorine. In this embodiment, therefore, the silicon nitride layer 212 contains chlorine. When the silicon nitride layer 212 significantly contains chlorine, the chlorine concentration is typically 0.1 atomic % or more, and more typically 0.3 atomic % or more. The chlorine concentration in the silicon nitride layer 212 may also be less than 1 atomic %. To reduce the dark current, the chlorine concentration in the silicon nitride layer 212 can be 1 atomic % or more, 2 atomic % or more, and 3 atomic % or more. If the chlorine concentration in the silicon nitride layer 212 is extremely high, the stability and transmittance decrease. Therefore, the chlorine concentration in the silicon nitride layer 212 can be 10 atomic % or less, and can also be 6 atomic % or less. Especially when the chlorine concentration is higher than 3 atomic %, the light absorption coefficient (k value) of incident light at a wavelength of 450 nm increases. Accordingly, the chlorine concentration can be 3 atomic % or less.

The present inventors have also found by experiments that the characteristics of the imaging device change in accordance with the bonding state of silicon contained in the silicon nitride layer 212 of the insulating film 210. A silicon atom (Si atom) connected to one, two, or three nitrogen atoms (N atoms) and not connected to an oxygen atom (O atom) is called an $SiN_x$ bond. When the ratio of $SiN_x$ bonds of silicon atoms contained in the silicon nitride layer 212 increases, the ratio of dangling bonds in the silicon nitride layer 212 increases. In the following explanation, the silicon nitride layer 212 covering the region 101 functions as a charge trap layer, and absorbs photoelectrons generated by incident light. This absorption of photoelectrons deteriorates that region of the silicon nitride layer 212, which has received light heading for the photoelectric conversion portion 11, and the output characteristic of the imaging device 1000 changes during imaging after that.

Figure 3B:
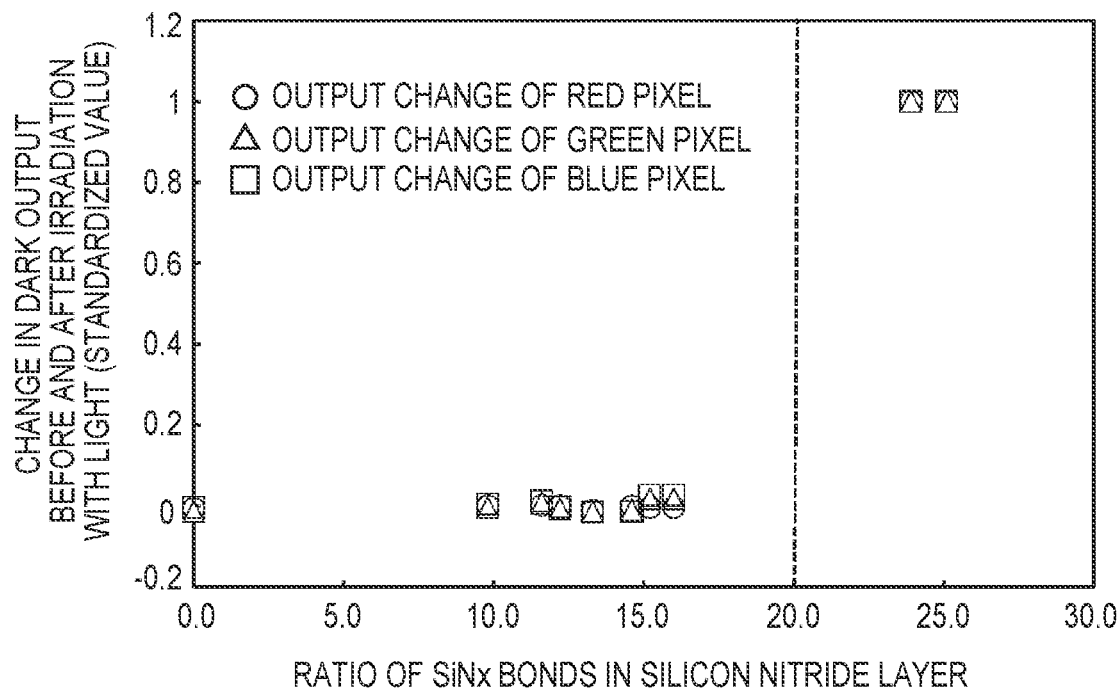

FIG. 3B is a view for explaining the relationship between the ratio of $SiN_x$ bonds in the silicon nitride layer 212 and the change amount of dark output before and after irradiation with light. In FIG. 3B, the abscissa indicates the ratio of $SiN_x$ bonds, and the ordinate indicates a value obtained by subtracting the dark output (current value) before irradiation with light from the dark output (current value) after irradiation with light. The value on the ordinate is standardized such that the change amount is 1 when the ratio of $SiN_x$ bonds is 25%. A round plot indicates the change amount of dark output of a red pixel (that is, a pixel for detecting red read light; this also applies to other colors), a triangular plot indicates the change amount of dark output of a green pixel, and a square plot indicates the change amount of dark output of a blue pixel. FIG. 3B shows that the change amount of dark output largely reduces when the ratio of $SiN_x$ bonds is 20% or less, compared to a case in which the ratio of $SiN_x$ bonds is higher than 20%. More specifically, assuming that the change amount of the dark current is 1 when the ratio of $SiN_x$ bonds is 25%, the change amount of the dark current is almost 0 when the ratio of $SiN_x$ bonds is 0% (inclusive)

to 20% (inclusive). In this embodiment, therefore, the ratio of $SiN_x$ bonds is set to 0% (inclusive) to 20% (inclusive).

XPS (X-ray Photoelectron Spectroscopy) can be used to measure the bonding state of a silicon atom. XPS is a method of obtaining knowledges about the type, existing amount, and chemical state of an element on the surface of a sample from a kinetic energy distribution of photoelectrons emitted by soft X-ray irradiation. In XPS, the bound energy on the sample surface irradiated with X-ray is found by analyzing the kinetic energy distribution of photoelectrons, so an element on the sample surface can be identified from the bound energy unique to the element.

Figure 4A:
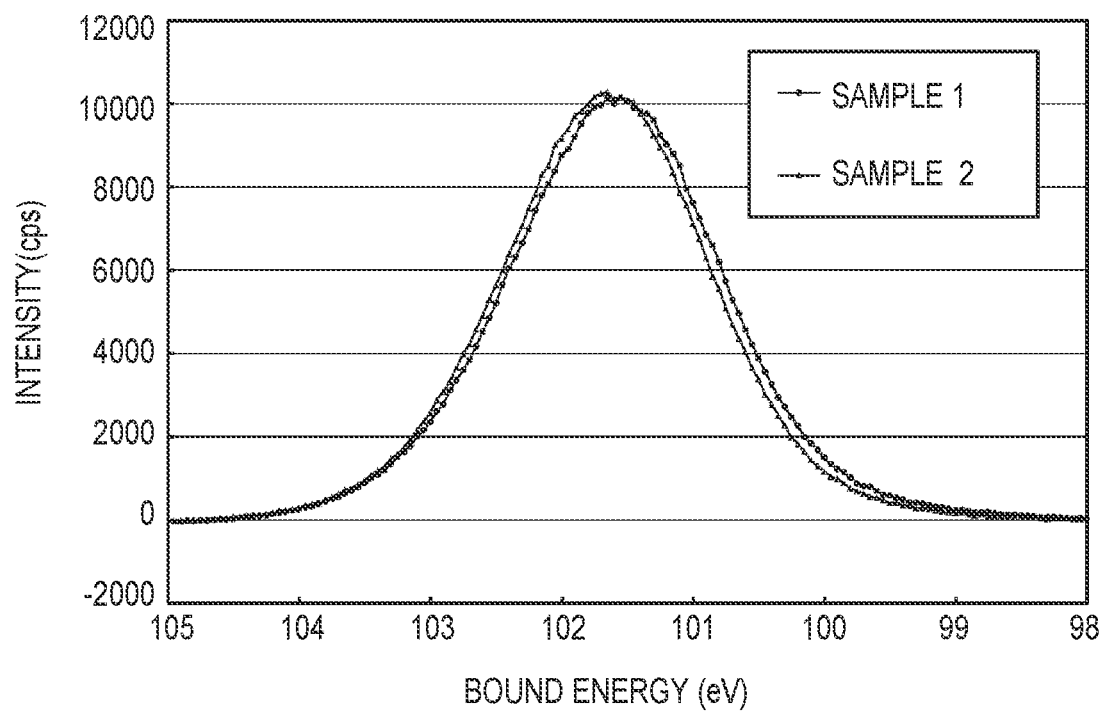
FIGS. 4A and 4B are views for explaining the relationship between bound energy and photoelectron intensity obtained by XPS measurement.
Figure 4B:
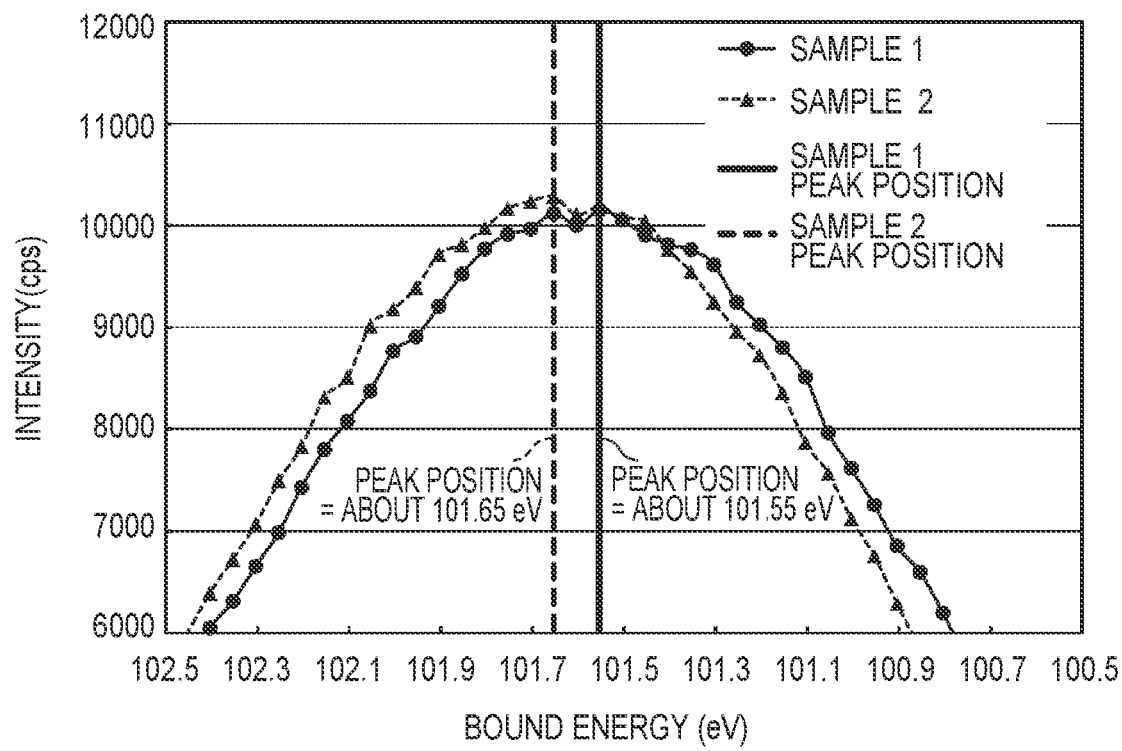

FIG. 4A is a graph for explaining the intensity distribution of the bound energy obtained by analyzing silicon nitride films (samples 1 and 2) deposited under different conditions, with respect to the Si2p orbit by XPS (a narrow scan mode). In FIG. 4A, the abscissa indicates the bound energy, and the ordinate indicates the intensity. FIG. 4B is a graph showing a portion of FIG. 4A in an enlarged scale.

Comparison of the bound energy peak positions of samples 1 and 2 reveals that the bound energy peak position of sample 1 is about 101.55 eV, and the bound energy peak position of sample 2 is about 101.65 eV. To analyze the bonding state of a silicon atom from this result, peak separation is performed by five typical types of peaks for a silicon nitride film. More specifically, to analyze the bonding state of a silicon nitride film, fitting is performed by the least squares method for the following five types, and the area ratios are compared. FIGS. 5A to 5E are views representing principal examples of the five bonding types, and each show only the bonding hands of a central silicon atom. Examples of the bonding types are not limited to those shown in FIGS. 5A to 5E.

First bonding type: a silicon atom bonded to only other silicon atoms.

Figure 5A:
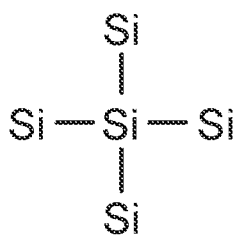
FIGS. 5A to 5E are views for explaining principal examples of first to fifth bonding types of five silicon atom bonding states for analyzing the bonding state of a silicon nitride film.

The bound energy peak position is about 99.4 eV. FIG. 5A shows a principal example of the first bonding type. In this example, silicon atoms are bonded to four hands of a silicon atom.

Second bonding type: a silicon atom bonded to one, two, or three nitrogen atoms and not bonded to an oxygen atom (the $SiN_x$ bond described above).

Figure 5B:
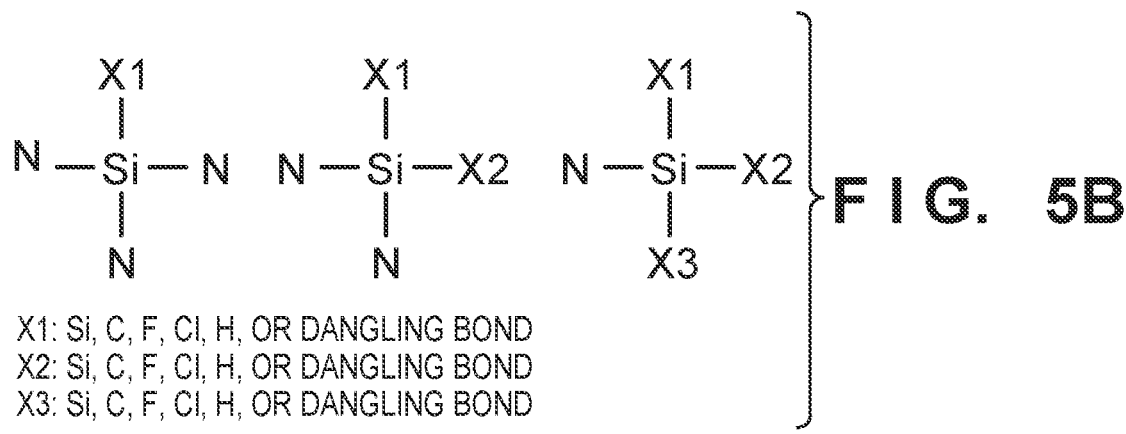

The bound energy peak position is about 101.0 eV. FIG. 5B shows principal examples of the second bonding type. In an example on the left side, nitrogen atoms are bonded to three hands of a silicon atom, and a silicon atom, a carbon atom, a fluorine atom, a chlorine atom, a hydrogen atom, or a dangling bond is bonded to one remaining hand. In an example in the center, nitrogen atoms are bonded to two hands of a silicon atom, and a silicon atom, a carbon atom, a fluorine atom, a chlorine atom, a hydrogen atom, or a dangling bond is bonded to each of two remaining hands. Elements to be connected to the two remaining hands can be the same or different. For example, a silicon atom can be connected to one hand, and a carbon atom can be connected to the other hand. This also applies to other bonding examples to be presented below. In an example on the right side, a nitrogen atom is bonded to one hand of a silicon atom, and a silicon atom, a carbon atom, a fluorine atom, a chlorine atom, a hydrogen atom, or a dangling bond is bonded to each of three remaining hands.

Third bonding type: a silicon atom bonded to four nitrogen atoms.

Figure 5C:
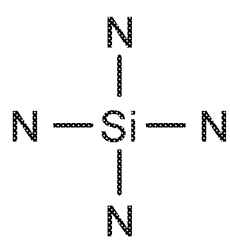

The bound energy peak position is about 101.8 eV. FIG. 5C shows a principal example of the third bonding type. In this example, nitrogen atoms are bonded to four hands of a silicon atom.

Fourth bonding type: a silicon atom bonded to at least one oxygen atom and at least one nitrogen atom.

Figure 5D:
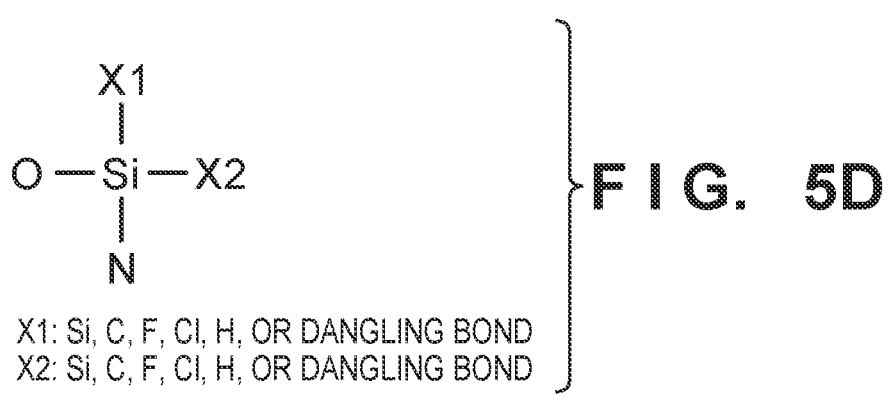

The bound energy peak value is about 102.7 eV. FIG. 5D shows a principal example of the fourth bonding type. In this example, a nitrogen atom is bonded to one hand of a silicon atom, an oxygen atom is bonded to another hand, and a silicon atom, a carbon atom, a fluorine atom, a chlorine atom, a hydrogen atom, or a dangling bond is bonded to each of two remaining hands.

Fifth bonding type: a silicon atom bonded to four oxygen atoms.

Figure 5E:
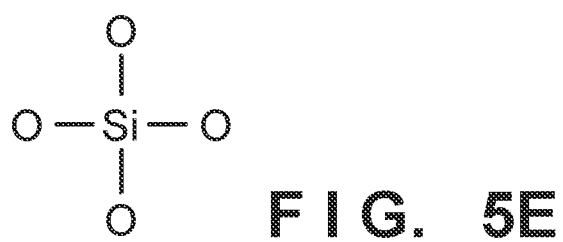

The bound energy peak position is about 103.6 eV. FIG. 5E shows a principal example of the fifth bonding type. In this example, oxygen atoms are bonded to four hands of a silicon atom.

Figure 6A:
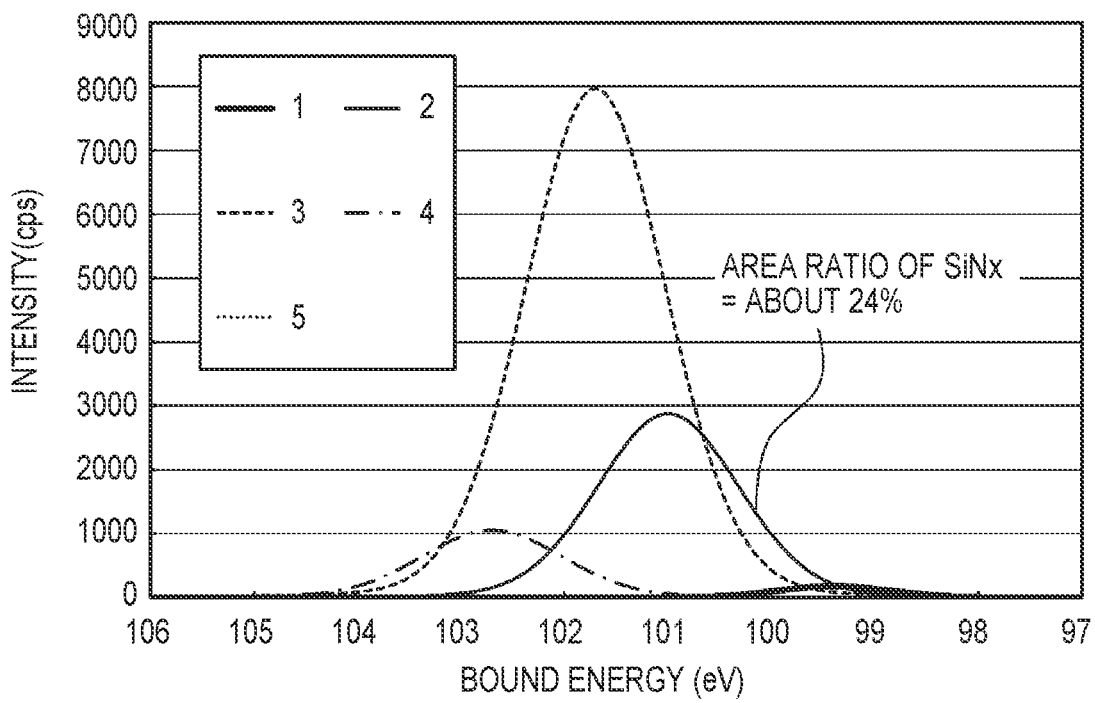
FIGS. 6A and 6B are views for explaining the relationship between bound energy and intensity obtained by fitting FIGS. 4A and 4B in relation to a predetermined peak position.
Figure 6B:
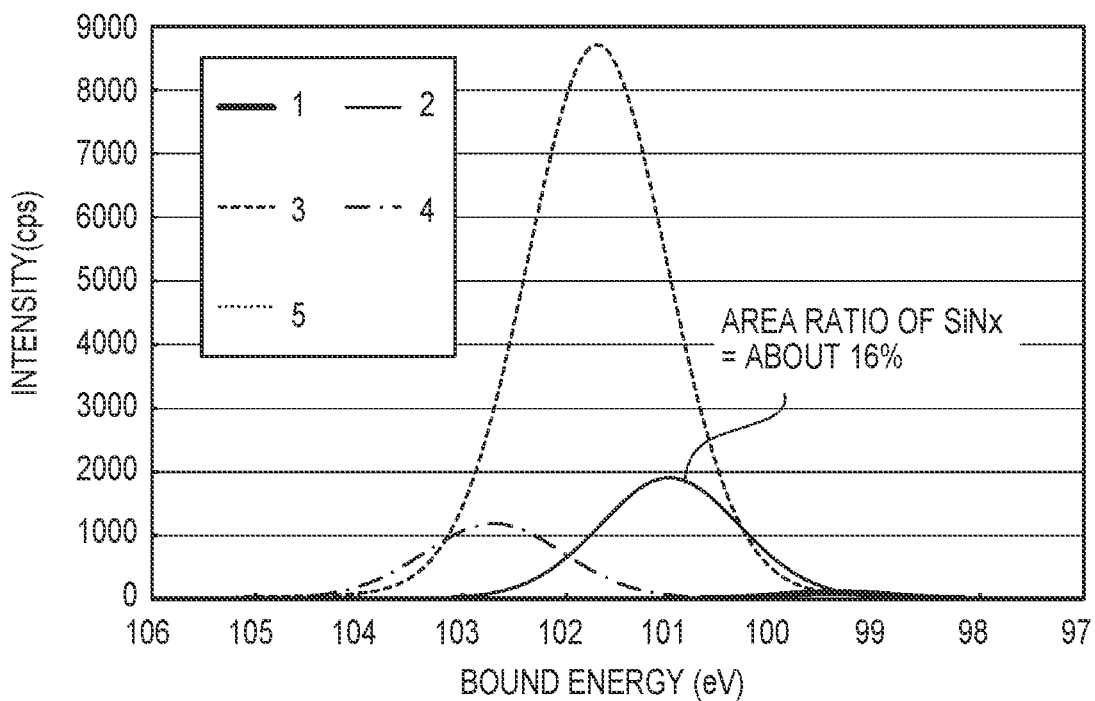

Referring to FIGS. 6A and 6B, legends 1 to 5 respectively represent the first to fifth bonding types. The values of these peak positions are typical examples, and can slightly shift forward or backward. For example, a silicon atom having a bound energy peak position higher than 100.5 eV and lower than 101.4 eV can be regarded as the second bonding type. Also, the number of bound energies to be used in peak separation is not limited to five. If there is another bond supposed to depend on a silicon nitride film, bound energy corresponding to the other bond can be added to fitting. The relationship between the bonding state and the corresponding bound energy can also be a well-known relationship. In this embodiment, of silicon atoms contained in the silicon nitride layer 212, the ratio of silicon atoms having a bound energy peak position higher than 100.5 eV and lower than 101.4 eV when measured by X-ray photoelectron spectroscopy is 20% or less. This makes it possible to decrease the ratio of $SiN_x$ bonds to 20% or less, and reduce the dark current change amount to almost 0.

FIG. 6A shows the result derived for sample 1 by the above-described fitting method. FIG. 6A demonstrates that silicon atoms of the second bonding type occupy an area ratio of about 24% of the whole. This result shows that the ratio of $SiN_x$ bonds is about 24% of silicon atoms contained in the silicon nitride film of sample 1. FIG. 6B shows the result derived for sample 2 by the above-described fitting method. FIG. 6B reveals that when a plurality of waveforms having different bound energy peak positions are fitted, the ratio of a waveform corresponding to silicon atoms of the second bonding type is about 16% in the total area of the plurality of waveforms. This result shows that the ratio of $SiN_x$ bonds is about 16% of silicon atoms contained in the silicon nitride film of sample 2. XPS is explained as a method of measuring the bonding state of a silicon atom, but the method is not limited to XPS, and the bonding state of a silicon atom may also be measured by an equivalent measurement method.

The sectional structure of the peripheral circuit region 2 will be explained below. An n-type impurity region 125, an n-type impurity region 126, and a silicide layer 134 are formed in the regions 108 equivalent to the source/drain regions of a peripheral nMOSFET. The impurity region 125 has an impurity concentration higher than that of the impurity region 126. The silicide layer 134 covers the impurity region 125. A p-type impurity region 127, a p-type impurity region 128, and a silicide layer 135 are formed in the regions 109 equivalent to the source/drain regions of a peripheral pMOSFET. The impurity region 127 has an impurity concentration higher than that of the impurity region 128. The silicide layer 135 covers the impurity region 127. Thus, the peripheral transistors have an LDD (Lightly Doped Drain)

structure by the heavily doped impurity regions 125 and 127 and the lightly doped impurity regions 126 and 128.

The gate electrodes 121 and 122 are formed on gate insulating films 123 and 124 on the substrate 100. In this embodiment, the gate insulating film contains silicon oxide as a main material, and this silicon oxide is formed by plasma nitriding or thermal oxynitriding and contains a slight amount (for example, less than 10%) of nitrogen, like the pixel transistor of the pixel 10. The thickness of the gate insulating films 123 and 124 of the peripheral transistors can be equal to or smaller than that of the gate insulating films 113 and 114 of the pixel transistors. For example, the thickness of the gate insulating films 113 and 114 can be 5.0 nm (inclusive) to 10 nm (inclusive), and the thickness of the gate insulating films 123 and 124 can be 1.0 nm (inclusive) to 5.0 nm (inclusive). By making the thickness of the gate insulating film of the pixel transistor and that of the gate insulating film of the peripheral transistor different from each other, it is possible to improve the breakdown voltage of the pixel transistor and the driving speed of the peripheral transistor at the same time. Silicide layers 132 and 133 forming portions of the gate electrodes 121 and 122 are formed on the upper surfaces of the gate electrodes 121 and 122. Thus, the peripheral transistors can have a SALICIDE (Self ALIgned siliCIDE) structure in which the silicide layers 132, 133, 134, and 135 are formed. As a metal component for forming the silicide layers, it is possible to use, for example, titanium, nickel, cobalt, tungsten, molybdenum, tantalum, chromium, palladium, or platinum.

Sidewalls 215 cover the side surfaces of the gate electrodes 121 and 122 of the peripheral transistors. The sidewalls 215 also cover the lightly doped impurity regions 126 and 128 in the regions 108 and 109. In this embodiment, the sidewalls 215 have a multilayered structure including a silicon oxide layer 213 and a silicon nitride layer 214. The silicon oxide layer 213 is positioned between the silicon nitride layer 214 and the gate electrodes 121 and 122, and between the silicon nitride layer 214 and the regions 108 and 109. The silicon oxide layer 213 and the silicon nitride layer 214 have interfaces in contact with each other.

An insulating film 220 including a silicon oxide layer 221 and a silicon nitride layer 222 (a second silicon nitride layer) is formed on the peripheral circuit region 2. In this embodiment, the insulating film 220 is a multilayered film of the silicon oxide layer 221 and the silicon nitride layer 222. The silicon oxide layer 221 and the silicon nitride layer 222 have interfaces in contact with each other. However, the insulating film 220 may also be a monolayered film of the silicon nitride layer 222. The silicon oxide layer 221 is positioned between the silicon nitride layer 214 and the silicon nitride layer 222. The silicon nitride layer 214 and the silicon oxide layer 221 have interfaces in contact with each other. That is, the sidewalls 215 and the insulating film 220 have interfaces in contact with each other. Furthermore, the insulating film 220 covers the silicide layers 134 and 135 in the regions 108 and 109. The insulating film 220 and the silicide layers 134 and 135 in the regions 108 and 109 have interfaces in contact with each other. The silicide layers 134 and 135 are formed in this embodiment, but it is not always necessary to form the silicide layers 134 and 135. In this case, the insulating film 220 covers the heavily doped impurity regions 125 and 127. The insulating film 220 and the heavily doped impurity regions 125 and 127 have interfaces in contact with each other. As in the pixel region 1, the insulating film 230 is formed on the insulating film 220. The contact holes 302 and 304 are formed to extend through the insulating film 230 and the insulating film 220 including the silicon oxide layer 221 and the silicon nitride layer 222. The conductive members 312 and 314 for electrically connecting an interconnection (not shown) and the regions 108 as the source/drain regions of the peripheral transistor and the gate electrodes 121 and 122 are formed in the contact holes 302 and 304. Like the conductive members 311 and 313, the conductive members 312 and 314 are contact plugs mainly made of a metal such as tungsten.

A wiring pattern (not shown) including interconnections to be connected to the conductive members 311, 312, 313, and 314 is formed on the insulating film 230. As this wiring pattern, a plurality of wiring patterns can be stacked with interlayer dielectric films being interposed between them. The wiring patterns can be made of a metal such as aluminum or copper. In addition, color filters (not shown) and microlenses (not shown) can be formed on the side of a light-receiving surface of the substrate 100 on which light is incident. These parts can be formed by using the existing techniques, so an explanation thereof will be omitted. The imaging device 1000 is accommodated in a package or the like, and an imaging system such as an apparatus or information terminal incorporating this package can be constructed.

Figure 7A:
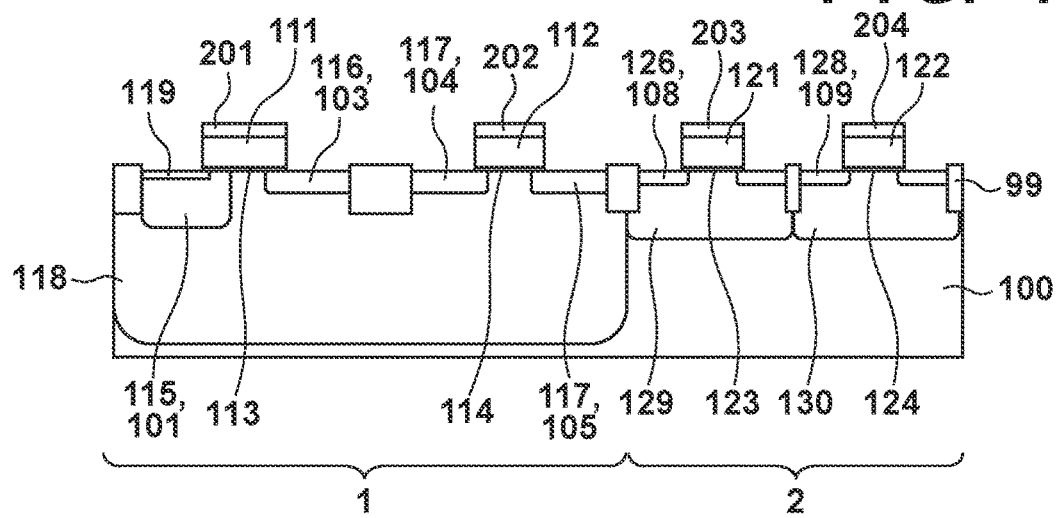
FIGS. 7A to 7C are sectional views showing an example of a method of manufacturing the imaging device of the first embodiment.

Next, a method of manufacturing the imaging device 1000 will be explained below with reference to FIGS. 7A to 9C. FIGS. 7A to 9C are sectional views of the individual manufacturing steps of the imaging device 1000. First, as shown in FIG. 7A, pixel transistors and peripheral transistors are formed. In this step of forming the pixel transistors and the peripheral transistors, an element isolation region 99 is formed on a substrate 100 by using the STI method or the LOCOS method. The substrate 100 can be either a silicon wafer cut out from a silicon ingot or a wafer obtained by epitaxially growing a single-crystal silicon layer on a silicon wafer. After the element isolation region 99 is formed, second-conductivity-type (p-type) wells 118 and 129 and a first-conductivity-type (n-type) well 130 are formed.

After the wells 118, 129, and 130 are formed, gate insulating films 113, 114, 123, and 124 are formed. Polysilicon is deposited on the gate insulating films 113, 114, 123, and 124. The gate insulating films 113, 114, 123, and 124 can be formed in the pixel region 1 and the peripheral circuit region 2 at the same time. These gate insulating films may also be formed by using different steps in order to obtain different film thicknesses in the pixel region 1 and the peripheral circuit region 2 as described previously. Then, an impurity is implanted by using ion implantation or the like in each prospective gate electrode formation portion of polysilicon, in accordance with the conductivity type of a corresponding transistor. After this impurity implantation, insulating layers 201, 202, 203, and 204 as hard masks are formed on those portions of polysilicon, which function as gate electrodes 111, 112, 121, and 122. After that, polysilicon in opening portions is etched by using the insulating layers 201, 202, 203, and 204 as masks. In this step, n-type gate electrodes 111, 112, and 121 and a p-type gate electrode 122 are formed.

Subsequently, an n-type storage region 115 and a p-type surface region 119 are formed. Also, an impurity region 116 of a region 103 and n-type impurity regions 117 having a single drain structure and functioning as the source/drain regions of a pixel transistor are formed. Furthermore, a lightly doped n-type impurity region 126 and a lightly doped p-type impurity region 128 having the LDD structure of peripheral transistors are formed. When forming the impurity regions 116 and 117 of the pixel 10, the dose can be $5 \times 10^{12}$ to $5 \times 10^{14}$ (ions/cm$^2$), and can also be $1 \times 10^{13}$ to $1 \times 10^{14}$ (ions/cm$^2$). Also, when forming the lightly-doped impurity regions 126 and 128 forming the LDD structure, the dose can be $5 \times 10^{12}$ to $5 \times 10^{14}$ (ions/cm$^2$), and can also be $1 \times 10^{13}$ to $1 \times 10^{14}$ (ions/cm$^2$). Accordingly, impurity implantation for the impurity regions 116 and 117 and the impurity region 126 can be performed in parallel. Furthermore, the order of impurity implantation for the storage region 115, the impurity regions 116, 117, 126, and 128, and the surface region 119 can be any order.

Figure 7B:
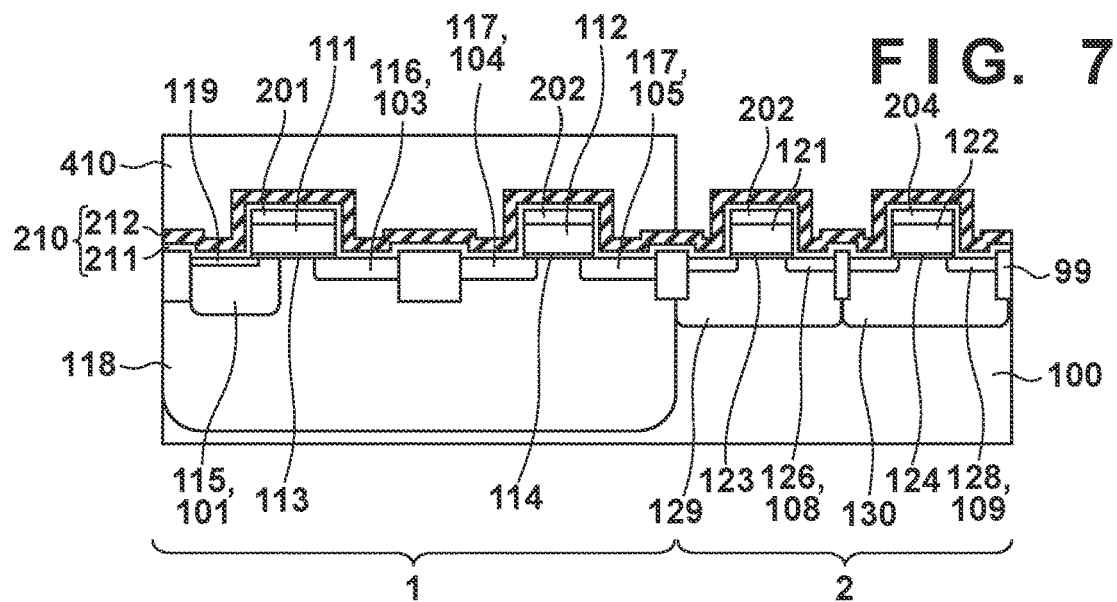

Then, as shown in FIG. 7B, an insulating film 210 including a silicon oxide layer 211 and a silicon nitride layer 212 is formed. The insulating film 210 covers the upper surfaces and side surfaces of the gate electrodes 111, 112, 121, and 122, regions 103, 104, 105, 108, and 109 serving as the source/drain regions of pixel transistors and peripheral transistors, and a region 101. The impurity regions 116, 117, 126, and 128 are formed in the source/drain regions in the step shown in FIG. 7A, so the insulating film 210 covers the impurity regions 116, 117, 126, and 128.

The insulating film 210 is a multilayered film of the silicon oxide layer 211 and the silicon nitride layer 212, and the silicon oxide layer 211 and the silicon nitride layer 212 are formed in contact with each other. The step of forming the insulating film 210 includes a step of forming the silicon oxide layer 211 and a step of forming the silicon nitride layer 212. As described earlier, the insulating film 210 is used as an antireflection layer, so the insulating film 210 covers at least the region 101 which functions as the photoelectric conversion portion 11, and the thickness of the silicon nitride layer 212 can be equal to or larger than that of the silicon oxide layer 211 in order to obtain a good antireflection characteristic. For example, the thickness of the silicon oxide layer 211 can be 5 nm (inclusive) to 20 nm (inclusive), and the thickness of the silicon nitride layer 212 can be 20 nm (inclusive) to 100 nm (inclusive).

In this embodiment, the silicon oxide layer 211 and the silicon nitride layer 212 are formed by using CVD (Chemical Vapor Deposition). For example, the silicon oxide layer 211 is formed by using LPCVD (Low-Pressure CVD) as thermal CVD in which the pressure (deposition pressure) of a process gas containing a source gas such as TEOS is set at 20 Pa (inclusive) to 200 Pa (inclusive). In this method, the deposition temperature (substrate temperature) can be 500° C. (inclusive) to 800° C. (inclusive). The process gas means a whole gas in a deposition chamber, which contains at least a source gas and contains a carrier gas added as needed. As the carrier gas, it is possible to use, for example, a rare gas such as helium or argon, or nitrogen. The deposition pressure means the pressure (total pressure) of the process gas in the deposition chamber.

The silicon nitride layer 212 is formed by, for example, LPCVD by using a process gas containing ammonia (NH$_3$) and hexachlorodisilane (HCD) as source gases. In this case, the pressure (deposition pressure) of the process gas can be 20 Pa (inclusive) to 200 Pa (inclusive), and the deposition temperature (substrate temperature) can be 500° C. (inclusive) to 800° C. (inclusive). Ammonia is one example of a nitrogen-containing gas, so another nitrogen-containing gas may also be used.

As described previously, to reduce the dark current and its output change, the silicon nitride layer 212 to be used as an antireflection film preferably contains chlorine, and the ratio of SiN$_x$ bonds of silicon atoms in the silicon nitride layer 212 is preferably 20% or less. A method of forming the silicon nitride layer 212 as described above will be explained below.

Figure 10:
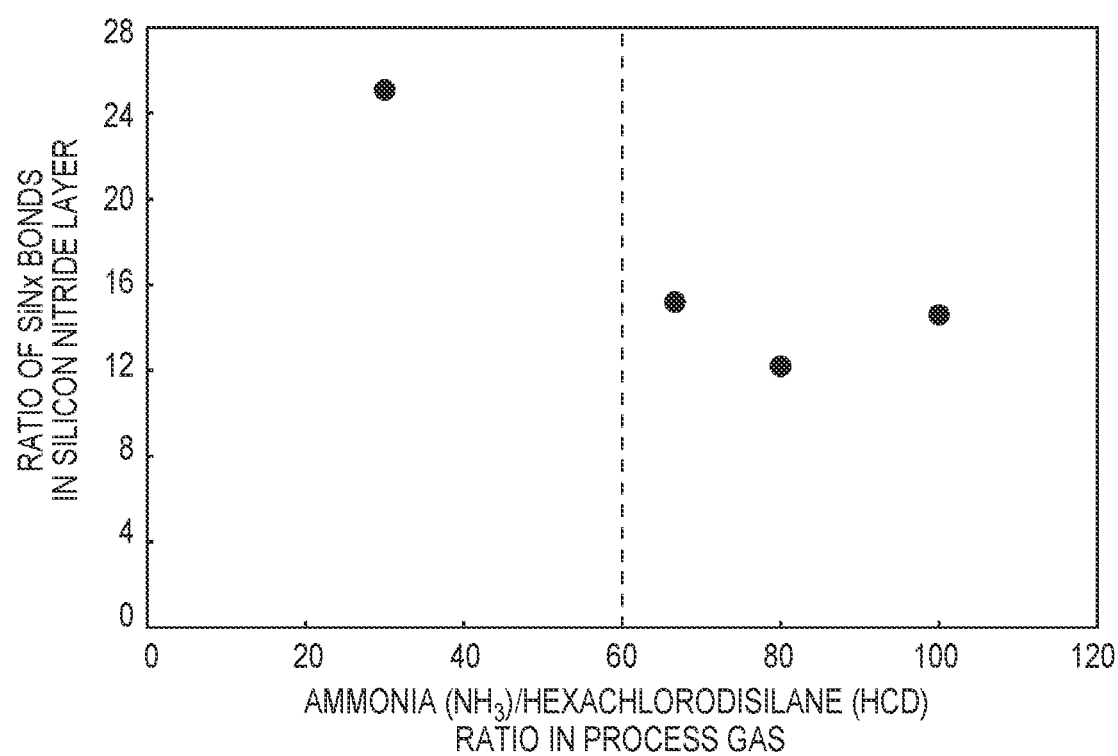
FIG. 10 is a view for explaining the relationship between the ammonia/hexachlorodisilane ratio in a process gas of the deposition conditions of the silicon nitride layer and the ratio of $SiN_x$ bonds in the silicon nitride layer.

FIG. 10 is a graph for explaining the relationship between the ratio of ammonia (NH$_3$)/hexachlorodisilane (HCD) in the process gas to be used in the formation of the silicon nitride layer 212, and the ratio of SiN$_x$ bonds in the silicon nitride layer 212. In FIG. 10, the abscissa indicates the ammonia/hexachlorodisilane ratio, and the ordinate indicates the ratio of SiN$_x$ bonds. As can be read from FIG. 10, the ratio of SiN$_x$ bonds is 20% when the ammonia/hexachlorodisilane ratio is 60 or more. Accordingly, to decrease the ratio of SiN$_x$ bonds in the silicon nitride layer 212 to 20% or less, the ammonia (NH$_3$)/hexachlorodisilane (HCD) ratio is preferably increased to 60 or more. The upper limit of this ratio is not defined, and can be, for example, less than 120. To increase the ammonia/hexachlorodisilane ratio to 60 or more, it is possible to adopt, for example, the following deposition conditions.

Deposition temperature: 550 to 650° C.
HCD: 10 to 40 sccm
NH$_3$: 1,000 to 3,000 sccm
Deposition pressure: 20 to 30 Pa Ammonia is used as a nitrogen-containing gas in the above-described example. Generally, the ratio of SiN$_x$ bonds is 20% when the nitrogen-containing gas/hexachlorodisilane ratio in the process gas is 60 or more.

The ratio of SiN$_x$ bonds can be changed by increasing/decreasing the flow rates of HCD and NH$_3$ in the process gas. The ratio of SiN$_x$ bonds can be reduced by increasing silicon atoms to be bonded to oxygen atoms, instead of increasing/decreasing the flow rates of HCD and NH$_3$. More specifically, an oxygen-containing gas can further be added to the process gas for forming the silicon nitride layer 212. The silicon nitride layer 212 can also be formed by forming a silicon nitride film by using a hexachlorodisilane-containing process gas, and annealing this silicon nitride film by using an oxygen-containing gas. Annealing like this can reduce the ratio of silicon atoms.

As disclosed in Japanese Patent Laid-Open No. 2013-84693, the silicon nitride layer 212 formed by using the process gas containing hexachlorodisilane (HCD) and ammonia (NH$_3$) in the source gas contains a large amount of hydrogen, in addition to silicon, nitrogen, and chlorine. Therefore, the silicon nitride layer 212 can function as a hydrogen supply source for terminating the dangling bond of the pixel transistor. Also, at least when the silicon nitride layer 212 is formed, the composition ratio of chlorine in the silicon nitride layer 212 can be lower than those of silicon, nitrogen, and hydrogen. In other words, the composition ratio of hydrogen in the silicon nitride layer 212 can be higher than that of chlorine in the silicon nitride layer 212. The composition ratio of hydrogen in the silicon nitride layer 212 can be either higher or lower than those of silicon and nitrogen in the silicon nitride layer 212. Since hydrogen is a light element, hydrogen in the silicon nitride layer 212 need not be included in consideration of the stoichiometric composition of the silicon nitride layer 212.

Figure 7C:
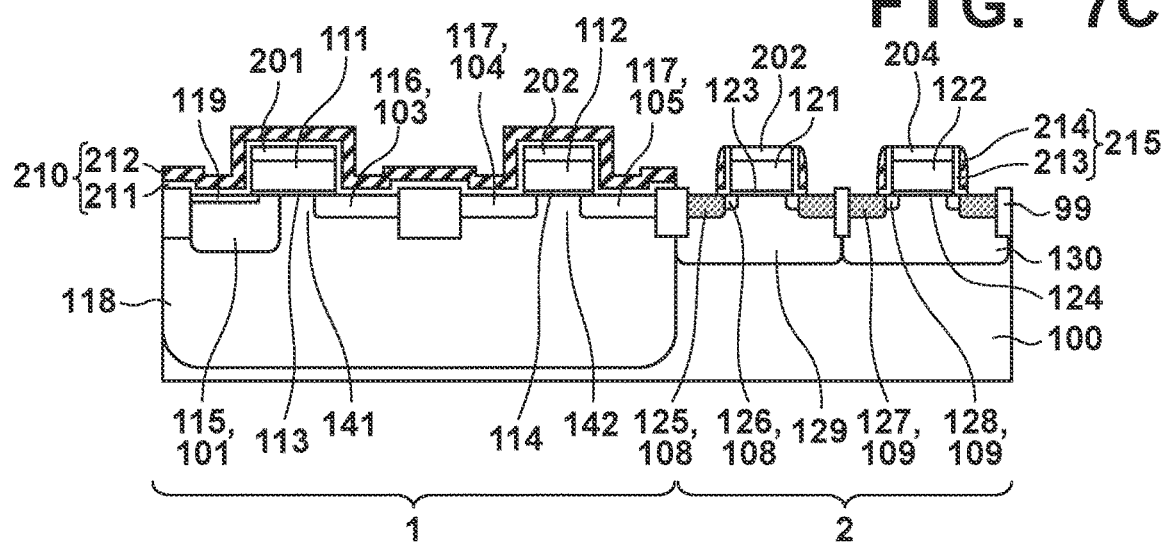

After the insulating film 210 is formed, sidewalls 215 are formed on the side surfaces of the gate electrodes 121 and 122 of the peripheral transistors. First, as shown in FIG. 7B, a mask pattern 410 is formed on the insulating film 210 by using a photoresist or the like. The mask pattern 410 is so formed as to cover at least a part of the region 101 which functions as the photoelectric conversion portion 11 in the pixel region 1. Since the mask pattern 410 covers at least a part of the region 101, the silicon nitride layer 212 in which the ratio of SiN$_x$ bonds is 20% or less and chlorine is contained remains on at least a part of the region 101. In this embodiment, the mask pattern 410 covers the pixel region 1 including the regions 101, 103, 104, and 105, and has an opening in the peripheral circuit region 2. Then, the insulating film 210 in the opening of the mask pattern 410 is etched (etched back). By removing the mask pattern 410 after this etching, sidewalls 215 covering the side surfaces of the gate electrodes 121 and 122 of the peripheral transistors shown in FIG. 7C are formed. The sidewalls 215 can be a stack of a silicon oxide layer 213 and a silicon nitride layer 214 (a third silicon nitride layer). The silicon oxide layer 213 is a part of the silicon oxide layer 211 of the insulating film 210, and the silicon nitride layer 214 is a part of the silicon nitride layer 212 of the insulating film 210. Therefore, the silicon nitride layers 212 and 214 are equal in the ratio of $SiN_x$ bonds and the chlorine concentration.

The etching for forming the sidewalls 215 exposes those regions of the region 108, in which impurity regions 125 and 127 are to be formed. Also, in this etching step, a prospective formation region of the resistance element 110 shown in FIG. 2A is exposed.

During the etching for forming the sidewalls 215, that portion of the insulating film 210, which is positioned above the region 101 remains because the mask pattern 410 covers the region 101. Since this suppresses etching damage to the photoelectric conversion portion 11, noise generated in the photoelectric conversion portion 11 can be reduced. In addition, since the mask pattern 410 covers the gate electrodes 111 and 112 and the regions 103 and 104, channel regions 141 and 142 of the pixel transistors and the insulating film 210 formed on the source/drain regions remain. This suppresses etching damage to the pixel transistors, and makes it possible to reduce noise generated in the pixel transistors.

After the etching for forming the sidewalls 215 exposes those regions of the region 108, in which impurity regions 125 and 127 are to be formed, self-aligned heavily-doped impurity regions 125 and 127 are formed along the side surfaces of the sidewalls 215. A mask pattern covering the pixel region 1 and the peripheral pMOSFET is formed, and an n-type impurity is implanted by ion implantation or the like by using the mask pattern, the gate electrode 121, and the sidewalls 215 as masks. Consequently, an impurity region 125 of the peripheral nMOSFET is formed. Also, a mask pattern covering the pixel region 1 and the peripheral nMOSFET is formed, and a p-type impurity is implanted by using ion implantation or the like by using the mask pattern, the gate electrode 122, and the sidewalls 215 as masks. Consequently, an impurity region 127 of the peripheral pMOSFET is formed. The formation order of the impurity regions 125 and 127 is an arbitrary order. When forming the heavily doped impurity regions 125 and 127 forming the LDD structure, the dose can be $5 \times 10^{14}$ to $5 \times 10^{16}$ (ions/cm$^2$), and can also be $1 \times 10^{15}$ to $1 \times 10^{16}$ (ions/cm$^2$). The dose when forming the impurity regions 125 and 127 is higher than that when forming the above-described impurity regions 126 and 128. As a consequence, the impurity concentration in the impurity regions 125 and 127 becomes higher than that in the impurity regions 126 and 128.

When forming at least one of the impurity regions 125 and 127, an impurity may also be implanted into a prospective formation region of a resistance element 110 at the same time. Consequently, a resistance element 110 as a diffusion resistance is formed. The impurity concentration obtained by the dose when forming the impurity regions 126 and 128 is low, so the resistance value of the resistance element 110 may not be decreased to a practical range. On the other hand, the dose when forming the impurity regions 125 and 127 can form the impurity region of the resistance element 110 having a practical resistance value. Therefore, a prospective formation region of the resistance element 110 is exposed by the etching for forming the sidewalls 215, and the impurity region of the resistance element 110 is formed at the same time the impurity is implanted into the impurity region 125 or 127.

Figure 8A:
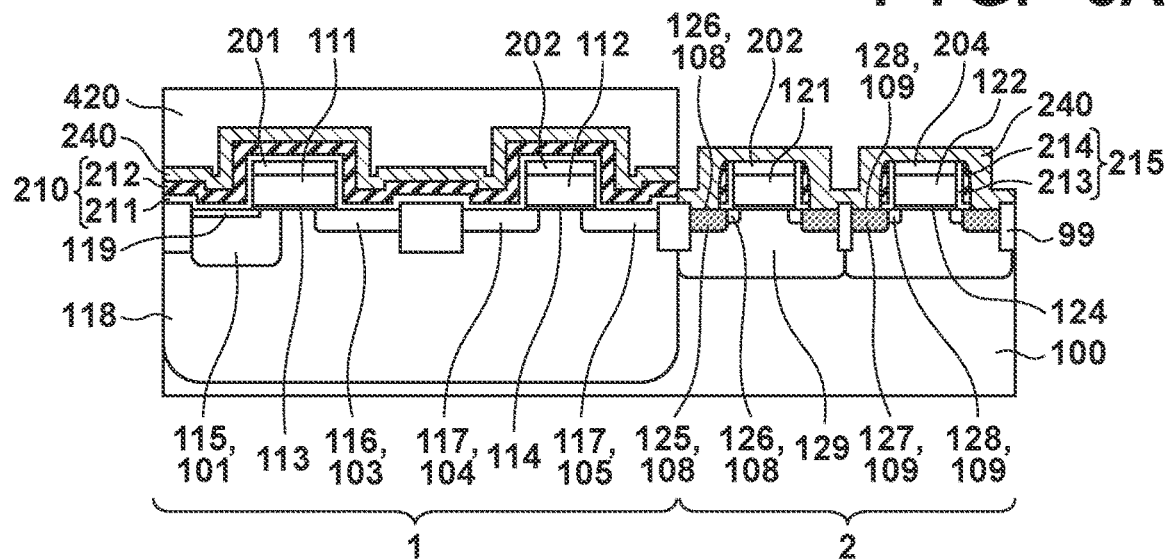
FIGS. 8A to 8C are sectional views showing the example of the method of manufacturing the imaging device of the first embodiment.

After the LDD structure of the peripheral transistors is formed, a protective film 240 is so formed as to cover the pixel region 1 and the peripheral circuit region 2 as shown in FIG. 8A. The protective film 240 is formed by using silicon oxide or the like, and has a thickness of about 30 nm (inclusive) to 130 nm (inclusive). After the protective film 240 is formed, a mask pattern 420 covering the pixel region 1 is formed by using a photoresist or the like. After the mask pattern 420 is formed, the protective film 240 in openings of the mask pattern 420 is etched. This etching removes those portions of the protective film 240, which are positioned above the regions 108 and 109 and positioned above the gate electrodes 121 and 122. In this step, those portions of the protective film 240, which are positioned above the pixel region 1 and the resistance element 110, are left behind. Following the etching of the protective film 240, the insulating layers 203 and 204 covering the upper surfaces of the gate electrodes 121 and 122 are removed. This etching of the insulating layers 203 and 204 can be performed simultaneously with the etching of the protective film 240, and can also be performed separately from that. After the protective film 240 and the insulating layers 203 and 204 are etched, the mask pattern 420 is removed.

Figure 8B:
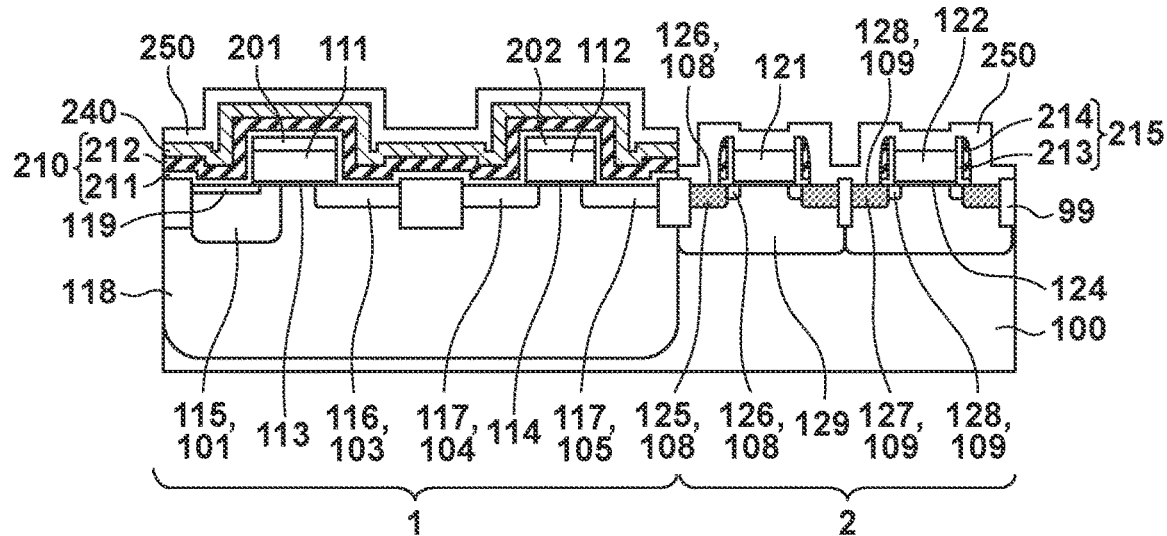

Then, as shown in FIG. 8B, a metal film 250 is so formed as to cover the substrate 100 by using sputtering, CVD, or the like. The metal film 250 is formed in contact with the regions 108 and 109 and the upper surfaces of the gate electrodes 121 and 122, and contains a metal which silicifies the regions 108 and 109 and the upper surfaces of the gate electrodes 121 and 122. Also, the metal film 250 is in contact with the protective film 240 on the pixel region 1 and the resistance element 110 which are not silicified. The metal film 250 may also have a multilayered structure including a metal for silicification and a metal compound for suppressing oxidation of the metal. For example, the metal film 250 may also be a multilayered film containing cobalt and titanium nitride for suppressing oxidation of cobalt.

After the metal film 250 is formed, the metal film 250 and the regions 108 and 109 and the gate electrodes 121 and 122 in contact with the metal film 250 are caused to react with each other by heating the substrate 100 to about 500° C. Consequently, silicide layers 132, 133, 134, and 135 in a monosilicide state are formed. After that, the protective film 240 and an unreacted metal film 250 positioned on the sidewalls 215 are removed. When a layer of a metal compound for suppressing oxidation of a metal is formed in the metal film 250, this metal compound layer is also removed. After the unreacted metal film 250 is removed, the silicide layers 132, 133, 134, and 135 are changed from the monosilicide state to a disilicide state by heating the substrate 100 to about 800° C. higher than the temperature used in the first silicification. Heating is performed twice at different temperatures in this embodiment, but the silicide layers 132, 133, 134, and 135 may also be formed by performing heating once. The silicification conditions can be selected as needed in accordance with, for example, the type of the metal for forming silicide.

Figure 8C:
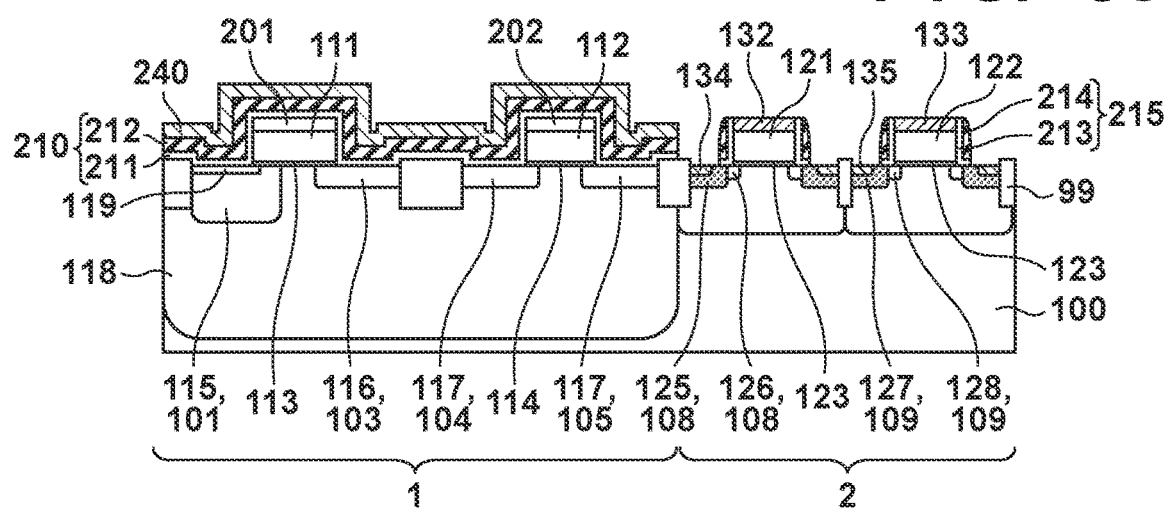

In the pixel region 1 and the resistance element 110 on which the protective film 240 remains in the silicification step, the metal film 250 is not in contact with the substrate 100 and the gate electrodes, so no silicide layer is formed. The protective film 240 thus functions as a silicide block. Since a silicide layer can cause noise in the pixel region 1, the pixel region 1 is covered with the protective film 240 during silicification. In particular, silicification is not performed on the region 101 as the photoelectric conversion portion 11, the region 103 as the node 14 for detecting electric charge, and the regions 104 and 105 as the source/drain regions of the amplification element 15. The resistance element 110 is also protected by the protective film 240 because the resistance value may become too small. The protective film 240 can be removed after the silicide layers 132, 133, 134, and 135 are formed. However, it is not always necessary to remove the protective film 240 in order to avoid unnecessary damage to the pixel region 1. In this embodiment, the protective film 240 is left behind as shown in FIG. 8C.

Figure 9A:
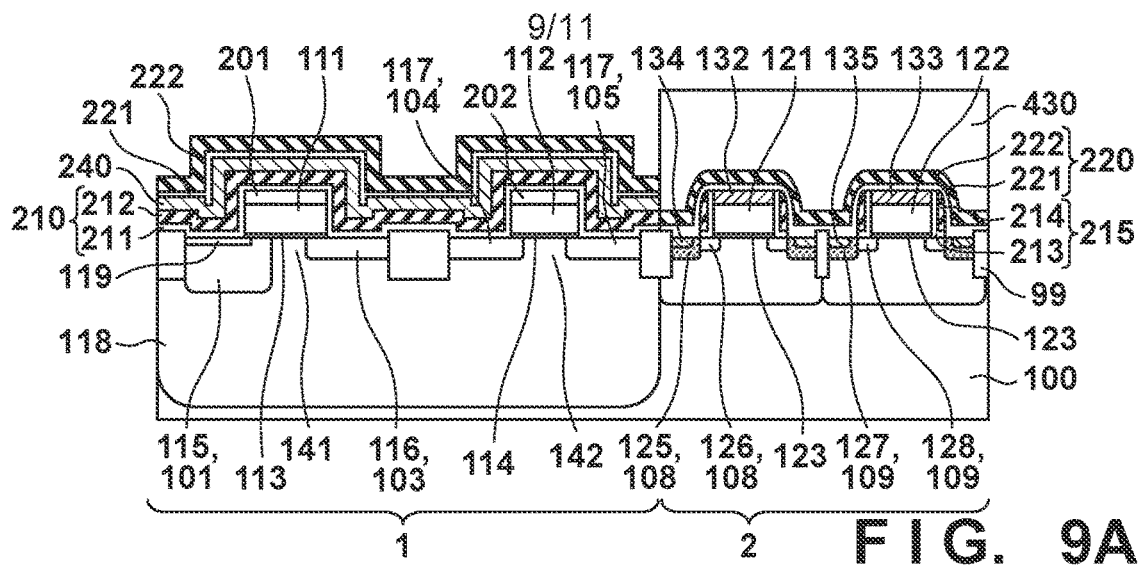
FIGS. 9A to 9C are sectional views showing the example of the method of manufacturing the imaging device of the first embodiment.

As shown in FIG. 9A, after the formation of the silicide layers 132, 133, 134, and 135, an insulating film 220 including a silicon oxide layer 221 and a silicon nitride layer 222 is formed. The insulating film 220 covers the upper surfaces of the gate electrodes 111, 112, 121, and 122, the sidewalls 215, the regions 103, 104, 105, 108, and 109 serving as the source/drain regions of the pixel transistors and the peripheral transistors, and the region 101.

The insulating film 220 is a multilayered film of the silicon oxide layer 221 and the silicon nitride layer 222. The silicon oxide layer 221 and the silicon nitride layer 222 are formed in contact with each other. The step of forming the insulating film 220 includes the step of forming the silicon oxide layer 221 and the step of forming the silicon nitride layer 222. The thickness of the silicon nitride layer 222 can be equal to or larger than that of the silicon oxide layer 221. The thickness of the silicon nitride layer 222 can be twice that of the silicon oxide layer 221 or more. For example, the thickness of the silicon oxide layer 221 can be 10 nm (inclusive) to 30 nm (inclusive), and the thickness of the silicon nitride layer 222 can be 20 nm (inclusive) to 100 nm (inclusive).

The silicon oxide layer 211 is formed by using SA-CVD (Sub-Atmospheric CVD) as thermal CVD in which the pressure (deposition pressure) of a process gas containing a source gas such as TEOS is set at 200 Pa (inclusive) to 600 Pa (inclusive). In this process, the deposition temperature (substrate temperature) can be 400° C. (inclusive) to 500° C. (inclusive). Thus, both the silicon oxide layers 211 and 221 can be formed by using thermal CVD.

The silicon nitride layer 222 is formed by LPCVD by using a process gas containing, for example, ammonia ($NH_3$) and hexachlorodisilane (HCD) as source gases. In this process, the pressure (deposition pressure) of the process gas is 20 Pa (inclusive) to 200 Pa (inclusive), and the deposition temperature (substrate temperature) is 500° C. (inclusive) to 800° C. (inclusive).

The silicon nitride layer 222 can also function as a chlorine supply source for stably supplying chlorine to the peripheral transistors. The thick silicon nitride layer 222 can contain a large amount of chlorine, and the thin silicon oxide layer 221 can appropriately permeate chlorine. In addition, the silicon nitride layer 222 formed by using the process gas containing hexachlorodisilane (HCD) and ammonia ($NH_3$) in the source gas as described above contains a large amount of hydrogen. This makes it possible to form a peripheral transistor having a good noise characteristic.

After the insulating film 220 is formed, as shown in FIG. 9A, a mask pattern 430 is formed by using a photoresist or the like so as to cover that portion of the insulating film 220, which is positioned in the peripheral circuit region 2. Then, those portions of the silicon nitride layer 212, which are positioned in the pixel region 1, are etched away through openings of the mask pattern 430. The portions to be removed of the silicon nitride layer 212 include those portions of the silicon nitride layer 212, which are positioned above the photoelectric conversion portion 11, the transfer element 12, the capacitance element 13, the amplification element 15, the reset element 16, and the selection element 17. In this process, the silicon oxide layer 221 can function as an etching stopper when etching away the silicon nitride layer 222 covering the pixel region 1. The silicon oxide layer 221 can also function as a protective layer for protecting the pixel region 1 from etching damage. The silicon nitride layer 222 positioned on at least the photoelectric conversion portion 11 of the pixel region 1 is removed.

Then, an insulating film 230 is so formed as to cover the pixel region 1 and the peripheral circuit region 2. The insulating film 230 is, for example, a monolayered film of silicon oxide deposited by plasma CVD such as HDP (High Density Plasma) CVD. The insulating film 230 can be formed from an arbitrary material such as a BPSG film, a BSG film, or a PSG film. The insulating film 230 is not limited to a monolayered film and may also be a multilayered film.

Figure 9B:
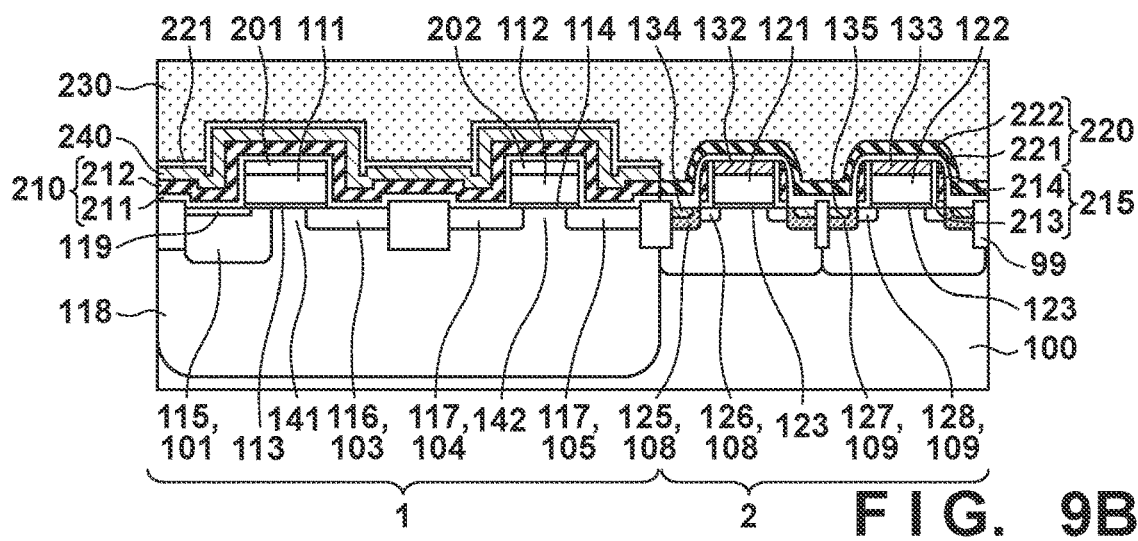

Subsequently, the surface of the insulating film 230 is planarized as shown in FIG. 9B. As a method of planarization, it is possible to use, for example, a CMP (Chemical Mechanical Polishing) method, a reflow method, or an etch back method. These methods may also be combined. The thickness of the insulating film 230 before the planarization can be, for example, 200 nm (inclusive) to 1,700 nm (inclusive). In this embodiment, those portions of the silicon nitride layer 222, which are positioned above the pixel region 1, are removed by the above-described step, so the difference between the heights of the pixel region 1 and the peripheral circuit region 2 below the insulating film 230 is small. Accordingly, the thickness of the planarized insulating film 230 can be decreased to 1,000 nm or less. For example, the thickness of the insulating film 230 may also be 450 nm (inclusive) to 850 nm (inclusive). By decreasing the thickness of the insulating film 230, it is possible to reduce the resistance of a contact plug and improve the sensitivity. The thickness of the planarized insulating film 230 can be larger than those of the insulating films 210 and 220.

After the planarization of the insulating film 230, conductive members 311, 312, 313, and 314 for electrically connecting the pixel transistors and the peripheral transistors to interconnections are formed. First, in the pixel region 1, a hole is formed in the insulating film 230 by anisotropic dry etching through an opening of a mask pattern using a photoresist or the like and covering the insulating film 230, thereby forming a contact hole 301 for forming the conductive member 311. When forming the contact hole 301, the silicon nitride layer 212 of the insulating film 210 can be used as an etching stopper in the pixel region 1. The contact hole 301 is formed to extend through the insulating film 230, the silicon oxide layer 221, the protective film 240, the silicon nitride layer 212, and the silicon oxide layer 211. The contact hole 301 exposes the source/drain regions of the capacitance element 13, the amplification element 15, the reset element 16, and the selection element 17, and the reference contact region 102.

In parallel with the formation of the contact hole 301, a contact hole 303 for exposing the gate electrodes of the capacitance element 13, the amplification element 15, the reset element 16, and the selection element 17 is formed. The contact hole 303 for forming the conductive member 313 extends through the insulating film 230, the silicon oxide layer 221, the protective film 240, the silicon nitride layer 212, and the silicon oxide layer 211. Furthermore, the contact hole for forming the conductive member 313 extends through the insulating layers 201 and 202. To reduce the contact resistance of contact plugs, an impurity can be implanted into the impurity regions and the gate electrodes of the substrate 100 through the contact holes.

Before the formation of the contact hole 301, the silicon nitride layer 222 positioned above the pixel region 1 is removed as described above. Accordingly, no silicon nitride layer exists above the silicon nitride layer 212 to be used as an etching stopper. When forming the contact hole 301, therefore, it is possible to suppress a silicon nitride layer other than the silicon nitride layer 212 from preventing the formation of the contact hole 301.

Figure 9C:
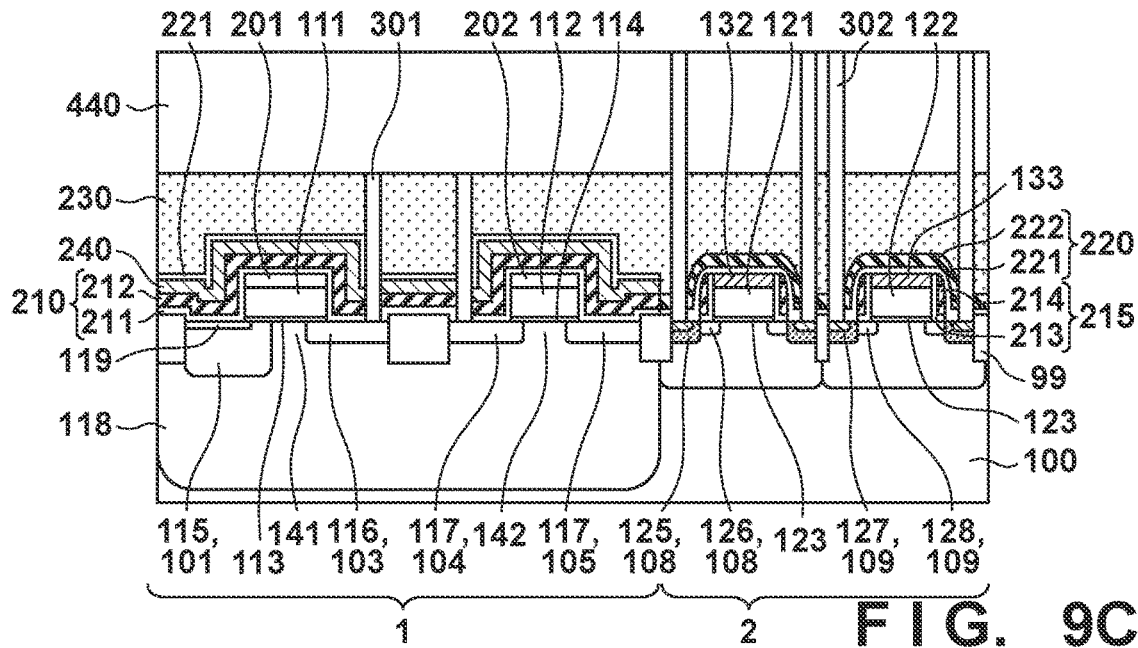

Then, as shown in FIG. 9C, holes are formed in the insulating film 230 by anisotropic dry etching in the peripheral circuit region 2 by using a mask pattern 440 which covers the insulating film 230 and has openings in prospective formation regions of contact holes 302 and 304. Consequently, contact holes 302 and 304 for forming the conductive members 312 and 314 are formed. When forming the contact hole 302, the silicon nitride layer 222 of the insulating film 220 can be used as an etching stopper in the peripheral circuit region 2. The contact holes 302 and 304 are formed to extend through the insulating film 230, the silicon nitride layer 222, and the silicon oxide layer 221. The contact hole 302 exposes the silicide layers 134 and 135 positioned in the regions 108 and 109 as the source/drain regions of the peripheral transistors. In parallel with the formation of the contact hole 302, the contact hole 304 for forming the conductive member 314 and exposing the silicide layers 132 and 133 of the gate electrodes 121 and 122 is formed.

After the contact holes 301, 302, 303, and 304 are formed, the conductive members 311, 312, 313, and 314 functioning as contact plugs are formed by filling a conductor such as a metal in the contact holes 301, 302, 303, and 304. The conductive members can be filled in the contact holes 301, 302, 303, and 304 at once.

The step of forming the contact holes 301 and 303 in the pixel region 1 and filling the conductive members 311 and 313 and the step of forming the contact holes 302 and 304 in the peripheral circuit region 2 and filling the conductive members 312 and 314 may also be different steps. By performing different contact plug formation steps in the pixel region 1 and the peripheral circuit region 2, it is possible to suppress the metal contained in the silicide layers 132, 133, 134, and 135 from contaminating the impurity regions in the pixel region 1 through the contact holes 301 and 303. The formation of the contact holes and the formation of the contact plugs by the filling of the conductive members can be performed first in either the pixel region 1 or the peripheral circuit region 2.

The structure shown in FIGS. 2A and 2B is obtained by the abovementioned steps. After that, the imaging device 1000 is completed by forming wiring patterns, color filters, microlenses, and the like. It is also possible to add a hydrogen annealing process for promoting hydrogen supply to the pixel transistors and the peripheral transistors, with the peripheral transistors being covered with the insulating film 220. The hydrogen annealing process means terminating the surface of the substrate 100 with hydrogen by heating the substrate 100 in a hydrogen atmosphere. The hydrogen annealing process can also be performed after the wiring patterns are formed after the formation of the conductive members 311, 312, 313, and 314.

The first embodiment of the present invention has been explained above, but the present invention is, of course, not limited to the first embodiment, and changes and combinations of the above-described first embodiment can be made as needed without departing from the spirit and scope of the invention. For example, in the above-described first embodiment, the present invention is explained by taking an imaging device as an example of a semiconductor device. However, the present invention is applicable not only to an imaging device but also to any semiconductor device including an insulated gate field-effect transistor, such as an arithmetic device, a storage device, a control device, a signal processing device, a detection device, or a display device.

An apparatus incorporating the imaging device 1000 will be explained below as an application example of the imaging device according to the above-described first embodiment. The concept of the apparatus includes not only an electronic apparatus such as a camera to be mainly used for imaging, but also an apparatus auxiliary having an imaging function, for example, an electronic apparatus such as a personal computer or a portable terminal, or a transport apparatus such as an automobile, a ship, or an airplane. By using the imaging device 1000 of the embodiment according to the present invention in a transport apparatus, it is possible to reduce changes in characteristics against intense light such as the sunlight. When designing, manufacturing, and selling a transport apparatus, therefore, the adoption of installation of the imaging device according to the embodiment of the present invention is effective in increasing the value of the transport apparatus. The apparatus incorporating the imaging device 1000 according to the present invention exemplified as the abovementioned first embodiment includes a processing unit for processing information based on an output signal from the imaging device 1000. This processing unit can include a processor for processing digital data as image data. The processor can calculate a defocus amount based on a signal from a pixel having a focus detecting function in the imaging device 1000, and perform a process for controlling focus adjustment of an imaging lens based on the defocus amount. An A/D converter for generating the abovementioned image data can be mounted on the substrate 100. Alternatively, it is possible to stack a substrate including the A/D converter on the substrate 100, and use the stack as the imaging device 1000. The A/D converter may also be separated from the imaging device 1000. In the apparatus incorporating the imaging device 1000, data obtained from the imaging device 1000 can be displayed on a display device included in the apparatus, or stored in a storage device included in the apparatus. Furthermore, in the apparatus incorporating the imaging device 1000, a mechanical device such as a motor included in the apparatus can be driven based on data obtained from the imaging device 1000.

Figure 11:
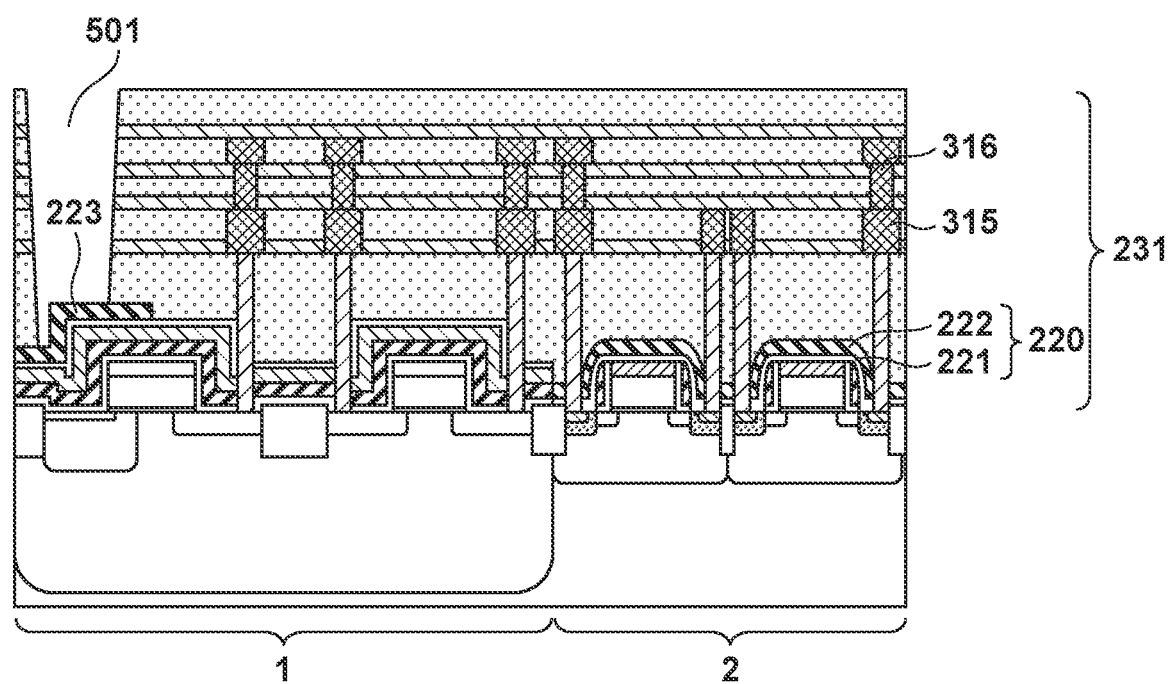
FIG. 11 is a sectional view of an imaging device of a second embodiment.

A manufacturing method of the second embodiment of the present invention will be explained below with reference to FIG. 11. The second embodiment is different from the first embodiment in that a waveguide is used to increase light to be incident on a photoelectric conversion portion 11, and is common to the first embodiment in other respects. In the second embodiment, a silicon nitride layer 222 is left behind on the photoelectric conversion portion 11, and a silicon nitride layer 223 is used as an etching stop film for forming a waveguide.

After the formation of an insulating film 220, a mask pattern is formed by using a photoresist or the like so as to cover that portion of the insulating film 220, which is positioned in a pixel region 1, and that portion of the insulating film 220, which is positioned in a peripheral circuit region 2. Then, that portion of a silicon nitride layer 212, which is formed in the pixel region 1, is etched away through an opening of the mask pattern. The silicon nitride layer 223 is formed on at least the photoelectric conversion portion 11 of the pixel region 1.

Then, a plurality of interlayer dielectric films 231, contact plugs, a first wiring layer 315, and a second wiring layer 316 including via plugs are formed. The plurality of interlayer dielectric films 231 are formed by, for example, alternately stacking silicon oxide layers and silicon nitride layers. The plurality of interlayer dielectric films 231 can be used as a clad of the waveguide. The first and second wiring layers 315 and 316 can be formed by, for example, a damascene method by using a material mainly containing copper, but may also be formed by using another material such as aluminum.

Subsequently, a hole 501 is formed in the plurality of interlayer dielectric films 231. The hole 501 is formed by, for example, forming a mask pattern having an opening in a region corresponding to the photoelectric conversion portion 11 on the plurality of interlayer dielectric films 231, and etching the plurality of interlayer dielectric films 231 by using the mask pattern as a mask. This etching is, for example, anisotropic etching. More specifically, plasma etching is performed on the plurality of interlayer dielectric films 231 until the silicon nitride layer 223 is exposed. The silicon nitride film 223 is a film for reducing plasma damage to the photoelectric conversion portion 11 during etching, and also functions as an etching stop film.

Then, the hole 501 is filled with a transparent material having a refractive index higher than that of the plurality of interlayer dielectric films 231 serving as a clad, thereby forming a portion serving as the core of the waveguide for guiding light to the photoelectric conversion portion 11. In this embodiment, silicon nitride having a refractive index higher than that of silicon oxide as a main material forming the plurality of interlayer dielectric films 231 is formed in the hole 501, but silicon oxide may also be used. More specifically, silicon nitride is deposited on the entire surface by HDP-CVD (High Density Plasma-CVD), thereby filling the hole 501 with silicon nitride. Silicon nitride formed in portions other than the hole 501 can be removed by, for example, chemical mechanical polishing or plasma etching. After that, the imaging device is completed by forming wiring patterns, color filters, microlenses, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2018-044665, filed Mar. 12, 2018, and No. 2018-217521, filed Nov. 20, 2018, which are hereby incorporated by reference herein in their entirety.

What is claimed is:

1. An imaging device comprising:
a substrate including a photoelectric conversion portion; and
an insulating layer formed to cover at least a part of the photoelectric conversion portion,
wherein at least a part of the insulating layer contains silicon, nitrogen, and chlorine, and
wherein at least some silicon atoms in the part of the insulating layer satisfy all of conditions (i)-(iii):
(i) being bonded to one, two, or three nitrogen atoms;
(ii) being bonded to one of another silicon atom, a carbon atom, a fluorine atom, a chlorine atom, and a hydrogen atom, or having a dangling bond; and
(iii) not being bonded to an oxygen atom, and
wherein a ratio of the silicon atoms in the part of the insulating layer that satisfy all of the conditions (i)-(iii) is not more than 20% of silicon atoms contained in the part of the insulating layer.

2. The device according to claim 1, further comprising a gate electrode of a transistor that transfers electric charge stored in the photoelectric conversion portion,
wherein a distance between a lower surface of that portion of the insulating layer, which covers the photoelectric conversion portion, and a surface of the substrate is shorter than a distance between an upper surface of the gate electrode and the surface of the substrate.

3. The device according to claim 2, wherein the insulating layer further covers the upper surface and a side surface of the gate electrode.

4. The device according to claim 1, wherein the insulating layer further contains hydrogen, and a composition ratio of chlorine in the insulating layer is lower than a composition ratio of each of silicon, nitrogen, and hydrogen.

5. The device according to claim 1, wherein a chlorine concentration in the insulating layer is not less than 0.3 atomic %.

6. The device according to claim 1, wherein a chlorine concentration in the insulating layer is not more than 6 atomic %.

7. The device according to claim 1, further comprising a silicon oxide layer formed between the photoelectric conversion portion and the insulating layer and in contact with the insulating layer,
wherein a thickness of the insulating layer is not less than that of the silicon oxide layer.

8. The device according to claim 1, wherein the insulating layer functions as an antireflection layer.

9. The device according to claim 1, wherein the substrate includes an amplification element, and the insulating layer extends from over the photoelectric conversion portion to over the amplification element.

10. An apparatus comprising:
an imaging device according to claim 1; and
a processing unit configured to process a signal output from the imaging device.

* * * * *